(12) United States Patent
Kurayama et al.

(10) Patent No.: US 11,606,891 B2
(45) Date of Patent: Mar. 14, 2023

(54) COMPONENT SUPPLY DEVICE AND SURFACE MOUNTING MACHINE

(71) Applicant: YAMAHA HATSUDOKI KABUSHIKI KAISHA, Shizuoka (JP)

(72) Inventors: Tomoharu Kurayama, Shizuoka (JP); Tomokazu Ohnuki, Shizuoka (JP); Hiroko Kakiuchi, Shizuoka (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 639 days.

(21) Appl. No.: 16/092,656

(22) PCT Filed: Feb. 6, 2017

(86) PCT No.: PCT/JP2017/004227
§ 371 (c)(1),
(2) Date: Oct. 10, 2018

(87) PCT Pub. No.: WO2017/187704
PCT Pub. Date: Nov. 2, 2017

(65) Prior Publication Data
US 2019/0133009 A1 May 2, 2019

(30) Foreign Application Priority Data
Apr. 28, 2016 (JP) .............................. JP2016-090289

(51) Int. Cl.
*H05K 13/04* (2006.01)
*H05K 13/02* (2006.01)
*H05K 13/08* (2006.01)

(52) U.S. Cl.
CPC ......... *H05K 13/0419* (2018.08); *H05K 13/02* (2013.01); *H05K 13/0215* (2018.08);
(Continued)

(58) Field of Classification Search
CPC ............... H05K 13/0419; H05K 13/02; H05K 13/0409; H05K 13/086; H05K 13/087;
(Continued)

(56) References Cited

U.S. PATENT DOCUMENTS 4,952,113 A * 8/1990 Fujioka ............... H05K 13/0419
29/740
2004/0200578 A1* 10/2004 Ju ....................... H05K 13/0419
156/765

(Continued)

FOREIGN PATENT DOCUMENTS

CN 1691884 A 11/2005
JP 2002-533943 A 10/2002
(Continued)

OTHER PUBLICATIONS

Machine Translation of Japanese Patent Publication, JP 2008-277509, Feb. 2022. (Year: 2022).*
(Continued)

*Primary Examiner* — A. Dexter Tugbang
(74) *Attorney, Agent, or Firm* — Studebaker & Brackett PC

(57) ABSTRACT

A component supply device including a main body provided with an introducing region into which a component supply tape holding components is introduced and configured to supply the components by sending the component supply tape introduced into the main body via the introducing region in a longitudinal direction of the component supply tape. The device comprises a tape supporter insertable into the introducing region while supporting the component supply tape, and a clamping mechanism configured to sandwich and hold at least a part of a supported part of the component supply tape supported by the tape supporter with respect to the tape supporter. The component supply tape is introduced into the main body by inserting the tape sup- (Continued)

porter into the introducing region with the component supply tape held by the clamping mechanism.

10 Claims, 14 Drawing Sheets

(52) U.S. Cl.
CPC ..... *H05K 13/0409* (2018.08); *H05K 13/0417* (2013.01); *H05K 13/086* (2018.08); *H05K 13/087* (2018.08); *Y10T 29/53174* (2015.01); *Y10T 29/53178* (2015.01); *Y10T 29/53183* (2015.01)

(58) Field of Classification Search
CPC ............ H05K 13/0215; H05K 13/0417; Y10T 29/53174; Y10T 29/53178; Y10T 29/53183
See application file for complete search history.

(56) References Cited

U.S. PATENT DOCUMENTS

| | | | | |
|---|---|---|---|---|
| 2006/0000334 | A1* | 1/2006 | Vroomans | H05K 13/0419 83/605 |
| 2006/0102681 | A1* | 5/2006 | Ricketson | H05K 13/0419 226/128 |
| 2015/0083845 | A1* | 3/2015 | Kawaguchi | H05K 13/0419 242/563 |
| 2015/0319892 | A1* | 11/2015 | Kawaguchi | H05K 13/0419 226/83 |

FOREIGN PATENT DOCUMENTS

| | | | | |
|---|---|---|---|---|
| JP | 2003-188578 | A | | 7/2003 |
| JP | 2008-041732 | A | | 2/2008 |
| JP | 2008277509 | A | * | 11/2008 |
| JP | 2011-211169 | A | | 10/2011 |
| JP | 2017199832 | A | * | 11/2017 ............ H05K 13/02 |
| WO | 2014/002912 | A1 | | 1/2014 |

OTHER PUBLICATIONS

S. Takyu, N. Okamoto, T. Yamada, T. Menjo and M. Nakamura, "A Novel Pick-Up and Place Process for FO-WLP Using Tape Expansion Machine Device," 2017 IEEE 67th Electronic Components and Technology Conference (ECTC), 2017, pp. 364-370, doi: 10.1109/ECTC.2017.112. (Year: 2017).*

Office Action mailed by the State Intellectual Property Office of the People's Republic of China dated Oct. 9, 2019, which corresponds to Chinese Patent Application No. 201780008779.3 and is related to U.S. Appl. No. 16/092,656.

International Search Report issued in PCT/JP2017/004227; dated May 9, 2017.

* cited by examiner

COMPONENT SUPPLY DEVICE AND SURFACE MOUNTING MACHINE

CROSS-REFERENCE TO RELATED APPLICATIONS

This application is a National Stage of International Patent Application No. PCT/JP2017/004227, filed Feb. 6, 2017, which claims benefit to Japanese Patent Application No. 2016-090289, filed on Apr. 28, 2016, the entire contents of both are incorporated herein by reference.

BACKGROUND

Technical Field

This disclosure relates to a component supply device and a component supply method for supplying components by sending a component supply tape holding the components and a surface mounting machine equipped with the above component supply device and particularly to a technique for introducing a new component supply tape into a main body.

Background Art

Numerous surface mounting machines for mounting components such as ICs (Integrated Circuits) and capacitors on a board have been conventionally provided. In a surface mounting machine, a component supply device is used to supply the components. For example, a component supply device described in JP 2011-211169A is provided with a carrier tape loading unit for receiving a carrier tape (corresponding to a "component supply tape" of the disclosure) accommodating components. The carrier tape introduced into this carrier tape loading unit is sent to a component pickup unit to supply the components after being temporarily put on standby.

SUMMARY

In the conventional device as described above, an operator inserts the carrier tape into the carrier tape loading unit via an opening (may also be referred to as an inlet or slot) provided in a case of the component supply device, whereby the carrier tape is introduced into the carrier tape loading unit. Here, insertion may be difficult in some cases depending on the work posture of the operator. Further, the opening may be in a blind spot from the operator. Furthermore, the opening is set to have a minimum necessary size. If the operator gets clumsy due to these factors in inserting the carrier tape into the above opening, the carrier tape cannot advance to the carrier tape loading unit and may be bent or creased.

Further, in the surface mounting machine, components are supplied with a plurality of component supply devices juxtaposed. Thus, also when a carrier tape is inserted into one component supply device, the operator needs to insert the carrier tape with other component supply devices kept adjacent to the one component. Improvement in workability has been desired.

This disclosure was developed in view of the above problem and aims to provide a technique capable of easily introducing a component supply tape into a main body of a component supply device without deforming the component supply tape.

A first aspect of the preset disclosure is a component supply device including a main body provided with an introducing region into which a component supply tape holding components is introduced and configured to supply the components by sending the component supply tape introduced into the main body via the introducing region in a longitudinal direction of the component supply tape. The device comprises a tape supporter insertable into the introducing region while supporting the component supply tape, and a clamping mechanism configured to sandwich and hold at least a part of a supported part of the component supply tape supported by the tape supporter with respect to the tape supporter. The component supply tape is introduced into the main body by inserting the tape supporter into the introducing region with the component supply tape held by the clamping mechanism.

A second aspect of the preset disclosure is a component supply method comprising an introducing step of introducing a component supply tape holding components into a main body via an introducing region of the main body, and a supplying step of supplying the components by sending the component supply tape introduced into the main body in a longitudinal direction of the component supply tape. The introducing step includes a step of supporting the component supply tape by a tape supporter insertable into the introducing region and sandwiching and holding at least a part of a supported part of the component supply tape supported by the tape supporter by the tape supporter and a clamping mechanism, and a step of introducing the component supply tape into the main body by inserting the tape supporter into the introducing region with the component supply tape held by the clamping mechanism.

A third aspect of the preset disclosure is a surface mounting machine. The machine comprises the above component supply device and a head unit configured to mount the components supplied from the component supply device on a board.

In the disclosure thus configured, the tape supporter insertable into the introducing region of the main body is provided. In a state where the supported part of the component supply tape is supported by the tape supporter and at least a part of the supported part is held by the clamping mechanism, the component supply tape is inserted together with the tape supporter into the introducing region of the main body. Since the component supply tape is inserted into the main body while being constantly supported by the tape supporter in this way, the component supply tape is stably inserted to prevent the deformation thereof as compared to the conventional technique of inserting the component supply tape singly into the main body of the component supply device. Further, since the component supply tape supported by the tape supporter is inserted into the introducing region while being held by the clamping mechanism, the component supply tape is more easily inserted into the main body as compared to the conventional technique.

In the disclosure configured as described above, the component supply tape is introduced into the main body by inserting the tape supporter into the introducing region of the main body in the state where the supported part of the component supply tape is supported by the tape supporter and at least a part of the supported part is held by the clamping mechanism. Thus, the component supply tape can be easily introduced into the main body of the component supply device without being deformed.

All of a plurality of constituent elements of each aspect of the disclosure described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the disclosure described above can be combined with some or all of technical features included in another aspect of the disclosure described above to obtain one independent form of the disclosure in order to solve some or all of the aforementioned problems or to achieve some or all of the effects described in this specification.

DETAILED DESCRIPTION

Figure 1:
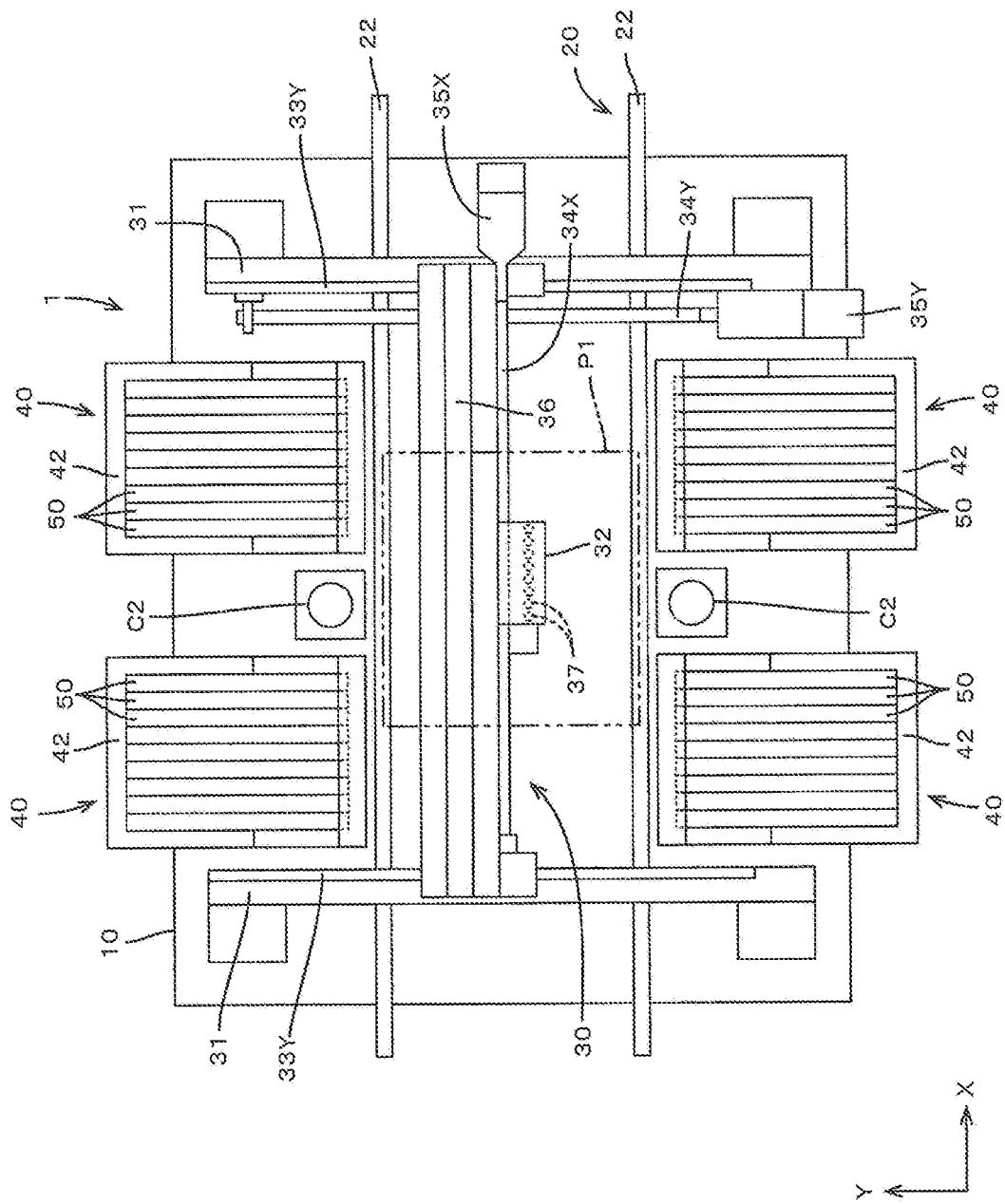
FIG. 1 is a diagram showing a surface mounting machine equipped with component supply devices according to a first embodiment of the disclosure.
Figure 2:
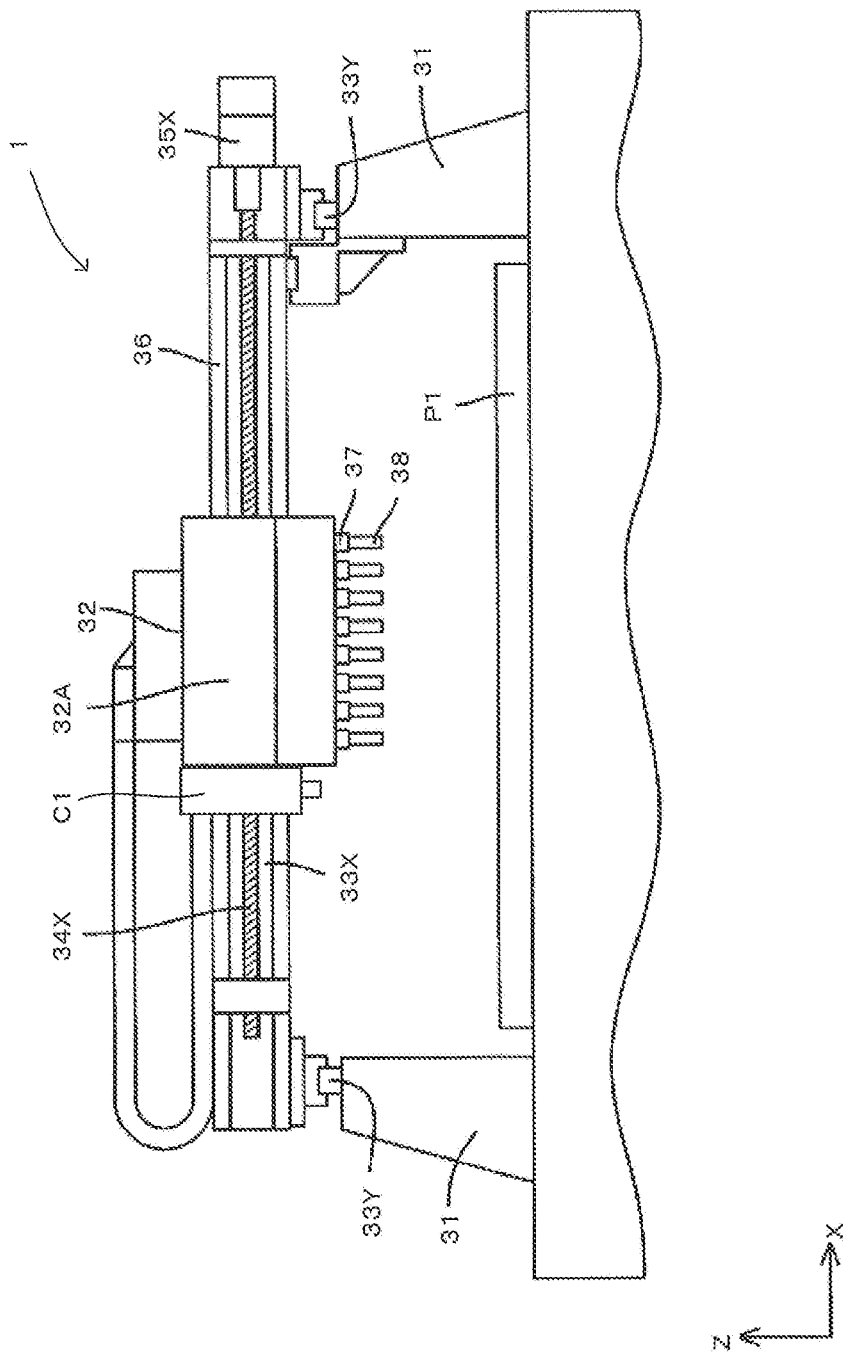
FIG. 2 is a partial front view of the surface mounting machine shown in FIG. 1.
Figure 3:
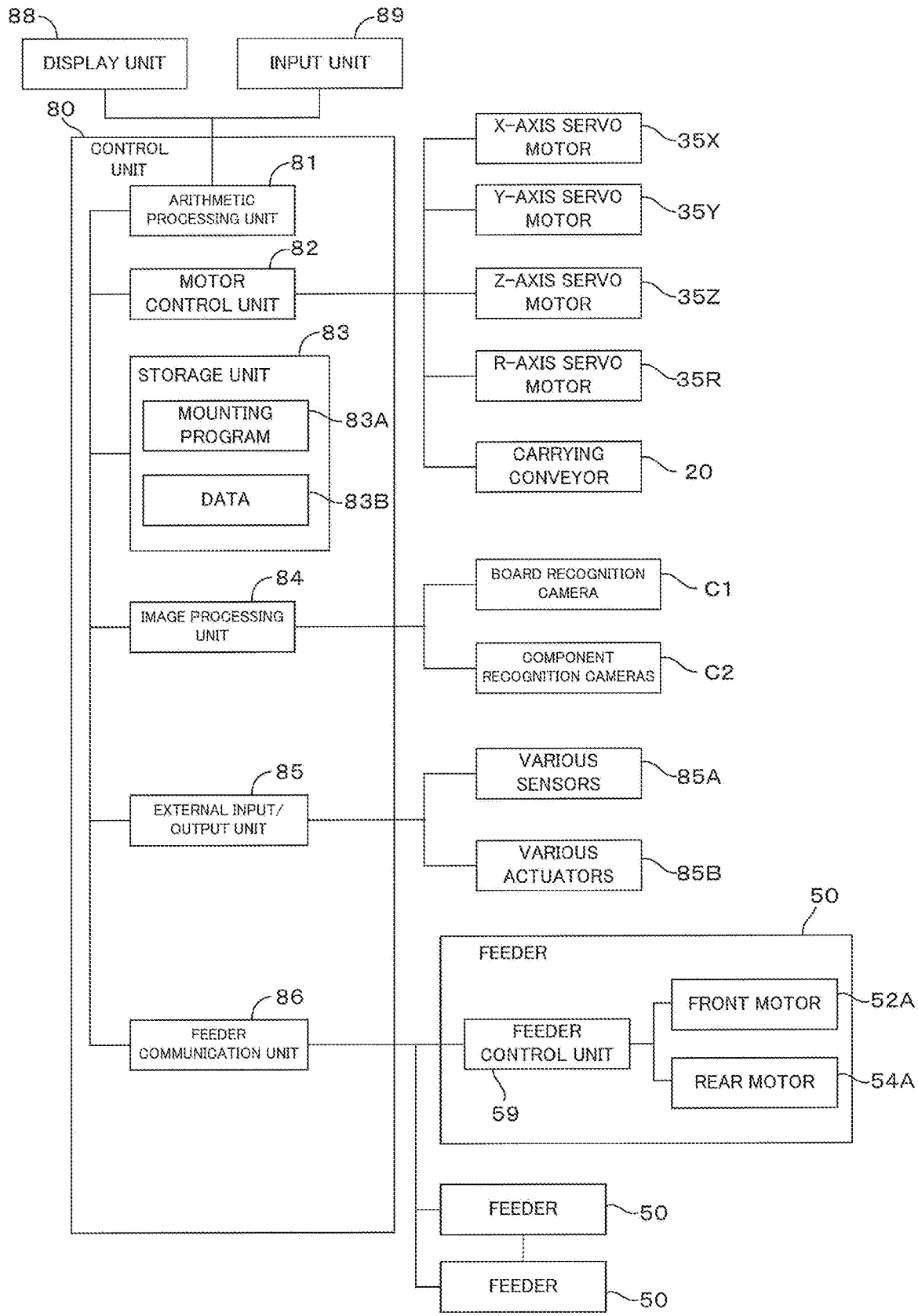
FIG. 3 is a block diagram showing an electrical configuration of the surface mounting machine shown in FIG. 1.

FIG. 1 is a diagram showing a surface mounting machine equipped with component supply devices according to a first embodiment of the disclosure. Further, FIG. 2 is a partial front view of the surface mounting machine shown in FIG. 1. Furthermore, FIG. 3 is a block diagram showing an electrical configuration of the surface mounting machine shown in FIG. 1. This surface mounting machine 1 is an apparatus for mounting components supplied by feeders 50 (corresponding to an example of a "component supply device" of the disclosure) mounted in feeder type supplying mechanisms 40 on a printed board P1 (corresponding to an example of a "board" of the disclosure) and includes, besides the feeder type supplying mechanisms 40, a base 10, a carrying conveyor 20 for conveying the printed board P1 and a component mounting apparatus 30 for mounting electronic components E1 on the printed board P1.

The base 10 has a rectangular shape in a plan view. The carrying conveyor 20 is provided on this base 10 in parallel to a longitudinal direction of the base 10. Further, a backup plate (not shown) for backing up the printed board P1 in mounting the electronic components E1 on the printed board P1 is provided below the carrying conveyor 20. In the following description, a long side direction (lateral direction of FIG. 1) of the base 10 and a conveying direction of the printed board P1 by the carrying conveyor 20 are referred to as an X-axis direction, a short side direction (vertical direction of FIG. 1) of the base 10 is referred to as a Y-axis direction and a vertical direction (vertical direction of FIG. 2) is referred to as a Z-axis direction.

The carrying conveyor 20 is arranged substantially at a central position of the base 10 in the Y-axis direction and conveys the printed board P1 in the conveying direction (X-axis direction). The carrying conveyor 20 includes a pair of conveyor belts 22 driven to circulate in the conveying direction X. The printed board P1 is placed between the both conveyor belts 22 and conveyed in the X-axis direction in that state. In this embodiment, the printed board P1 is carried in to a working position (position enclosed by chain double-dashed line of FIG. 1) on the base 10 along the conveyor belts 22 from one side (right side shown in FIG. 1) in the conveying direction X, and carried out to the other side (left side shown in FIG. 1) along the conveyor belts 22 after the printed board P1 is stopped at the working position and the electronic components E1 are mounted.

The component mounting apparatus 30 includes a pair of support frames 31, a head unit 32 and a head unit driving mechanism for driving the head unit 32. The respective support frames 31 are located on both sides of the base 10 in the X-axis direction and extend in the Y-axis direction. The support frame 31 is provided with an X-axis servo mechanism and a Y-axis servo mechanism constituting the head unit driving mechanism. The X-axis servo mechanisms and Y-axis servo mechanisms operate in response to an operation command from a control unit 80 for controlling the entire apparatus, whereby the head unit 32 moves in the X-axis direction and the Y-axis direction within a certain movable region.

The Y-axis servo mechanism includes a Y-axis guide rail 33Y, a Y-axis ball screw 34Y and a Y-axis servo motor 35Y. In this Y-axis servo mechanism, the Y-axis guide rail 33Y extends along each support frame 31. Further, the Y-axis ball screw 34Y extends in parallel to each Y-axis guide rail 33Y. The Y-axis servo motor 35Y is mounted on one end of this Y-axis ball screw 34Y and operates in response to a drive command from the control unit 80, whereby a ball nut (not shown) threadably engaged with the Y-axis ball screw 34Y moves in the Y-axis direction. A head supporting body 36 is fixed to these ball nuts. The head supporting body 36 extends in the X-axis direction. The head supporting body 36 is arranged on the ball nuts to bridge two Y-axis guide rails 33Y, and movable along the Y-axis guide rails 33Y. Thus, if the energization of the Y-axis servo motor 35Y is controlled by the control unit 80, the head supporting body 36 fixed to the ball nuts and the head unit 32 to be described later move in the Y-axis direction along the Y-axis guide rails 33Y by forward and backward movements of the ball nuts described above.

The X-axis servo mechanism includes an X-axis guide rail 33X (see FIG. 2), an X-axis ball screw 34X and an X-axis servo motor 35X. In this X-axis servo mechanism, the X-axis guide rail 33X extends in the X-axis direction with respect to the head supporting body 36. Further, the X-axis ball screw 34X extends in parallel to the X-axis guide rail 33X. The X-axis servo motor 35X is mounted on one end of this X-axis ball screw 34X and operates in response to a drive command from the control unit 80, whereby a ball nut (not shown) threadably engaged with the X-axis ball screw 34X moves in the X-axis direction. The head unit 32 is fixed to the ball nuts, and moves in the X-axis direction along the X-axis guide rails 33X as the above ball nuts move.

The head unit 32 takes out the electronic components E1 supplied by the feeder type supplying mechanisms 40 to be described later and mounts the taken-out electronic components E1 on the printed board P1. As shown in FIG. 2, a plurality of mounting heads 37 for performing a mounting operation of the electronic components E1 are carried in a row on the head unit 32. Each mounting head 37 projects downward from the lower surface of the head unit 32 and a suction nozzle 38 for sucking the electronic component E1 by a negative pressure is provided on the tip of each mounting head 37.

Each mounting head 37 can be rotated about an axis extending in the vertical direction Z by an R-axis servo motor 35R (FIG. 3). Further, each mounting head 37 can be raised and lowered in the vertical direction Z with respect to a frame 32A of the head unit 32 by the drive of a Z-axis servo motor 35Z (FIG. 3).

The head unit 32 is provided with a board recognition camera C1 (FIG. 2). The board recognition camera C1 is fixed to the frame 32A of the head unit 32 with an imaging surface faced down, and moves integrally with the head unit 32. The board recognition camera C1 images an image at an arbitrary position on the printed board P1 stopped at the working position by being moved in the X-axis direction and the Y-axis direction.

Further, component recognition cameras C2 (FIG. 1) are fixed near a mounting position by the head unit 32 above the base 10. The component recognition cameras C2 recognize suction postures and the like of the respective electronic components E1 by the suction nozzles 38 by imaging images of the electronic components E1 taken out at component supply positions S1 (see FIG. 4 to be described later) by the mounting heads 37.

To control each part of the surface mounting machine 1 configured as described above, the control unit 80 is provided. The control unit 80 includes an arithmetic processing unit 81 configured by a CPU (Central Processing Unit). Each of a motor control unit 82, a storage unit 83, an image processing unit 84, an external input/output unit 85, a feeder communication unit 86, a display unit 88 and an input unit 89 is connected to the arithmetic processing unit 81.

The motor control unit 82 drives the X-axis servo motor 35X and the Y-axis servo motor 35Y for the head unit 32 and drives the Z-axis servo motor 35Z and the R-axis servo motor 35R for each mounting head 37 in accordance with a mounting program 83A to be described later. Further, the motor control unit 82 drives the carrying conveyor 20 in accordance with the mounting program 83A.

The storage unit 83 is configured by a ROM (Read Only Memory), a RAM (Random Access Memory) and the like and the mounting program 84A and various pieces of data 83B are stored therein. The mounting program 83A stored in the storage unit 83 includes board information on a production volume of printed boards P1 as mounting targets, component information including the numbers, types and the like of the electronic components E1 to be mounted on the printed boards P1, and the like. The various pieces of data 83B stored in the storage unit 83 include data on the numbers and types of the electronic components E1 held in the respective feeders 50 mounted in the feeder type supplying mechanisms 40 and the like.

Each of imaging signals output from the board recognition camera C1 and the component recognition cameras C2 is taken into the image processing unit 84. In the image processing unit 84, an analysis of component images, an analysis of board images and the like are performed based on the taken-in imaging signals from the respective cameras C1, C2.

The external input/output unit 85 is a so-called interface and configured to take in detection signals output from various sensors 85A provided in a main body of the surface mounting machine 1. Further, the external input/output unit 85 is configured to control the operation of various actuators 85B provided in the main body of the surface mounting machine 1 based on a control signal output from the arithmetic processing unit 81.

The feeder communication unit 86 is connected to a feeder control unit 59 of each feeder 50 mounted in the feeder type supplying mechanism 40, and comprehensively controls each feeder 50. The feeder control unit 59 controls the drive of a front motor 52A and a rear motor 54A in the feeder 50 by a control in accordance with the mounting program 83A. Further, the feeder control unit 59 is connected to a tape sensor (not shown) in the feeder 50 and takes in a detection signal output from this tape sensor. The configuration and operation of the feeder 50 is described in detail later.

The display unit 88 is configured by a liquid crystal display device or the like having a display screen and displays a state of the surface mounting machine 1 and the like on the display screen. The input unit 89 is configured by a keyboard or the like and receives an input from outside by a manual operation.

Figure 4:
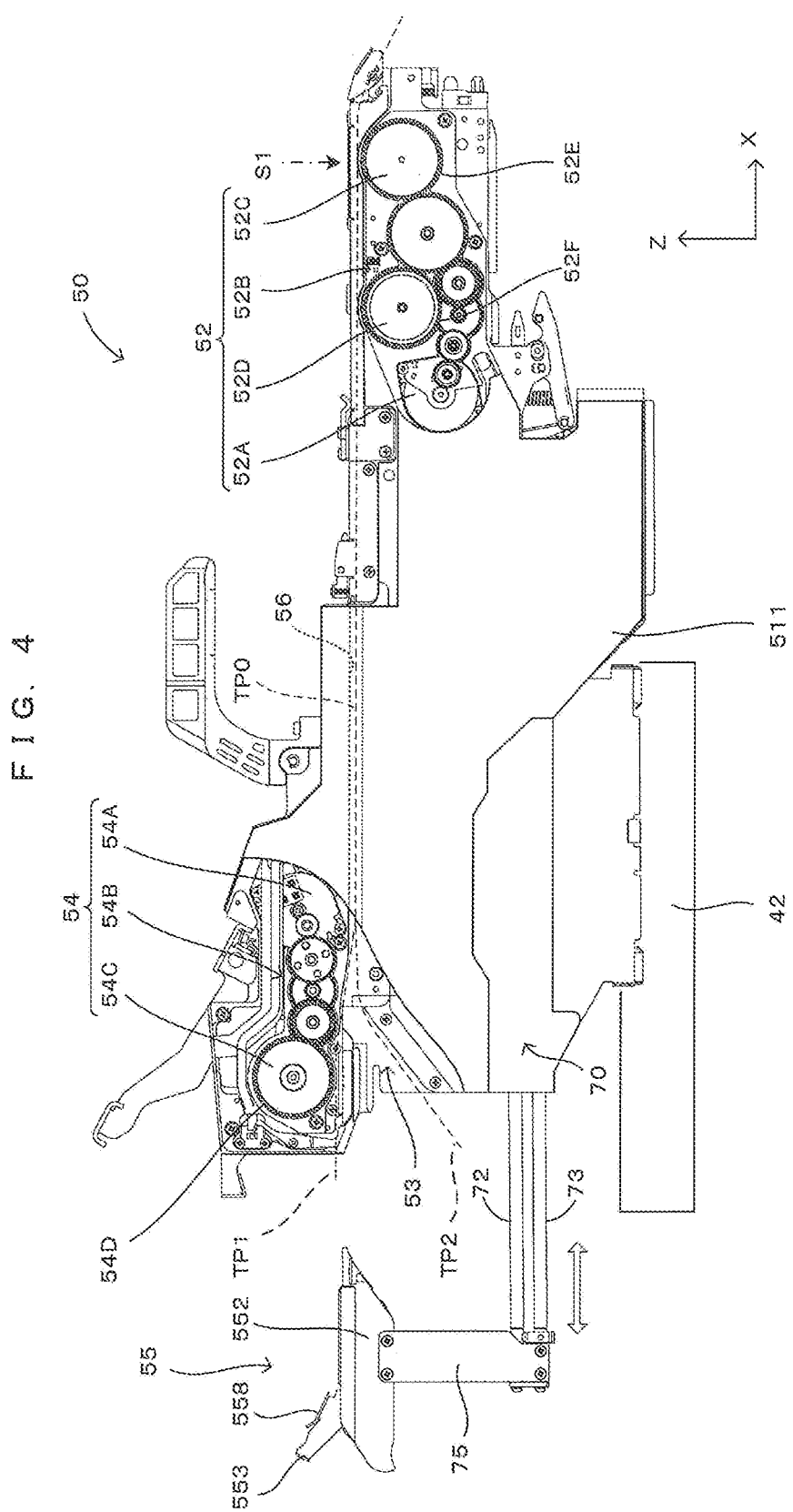
FIG. 4 is a diagram showing the configuration of the feeder as an example of the first embodiment of the disclosure.
Figure 5:
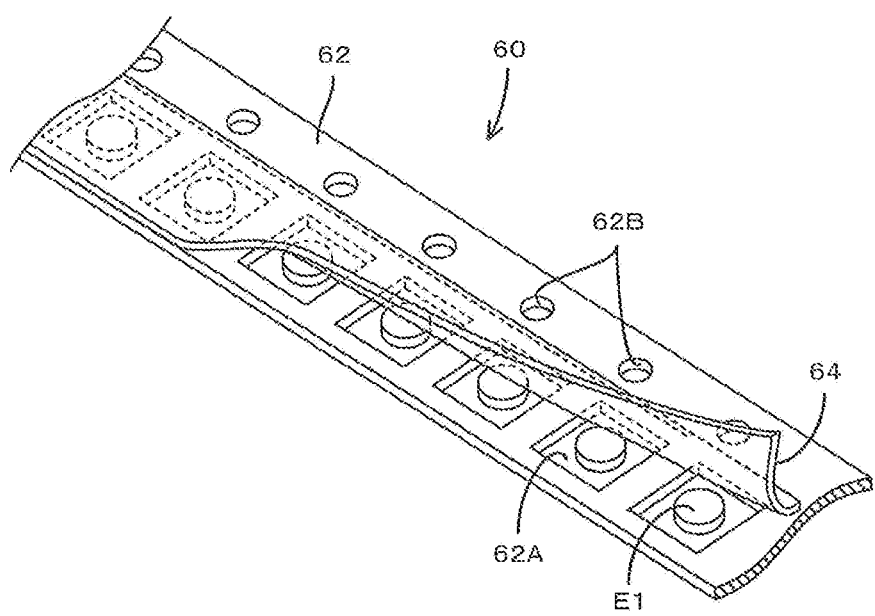
FIG. 5 is a perspective view showing the configuration of a component supply tape used to supply the components.

FIG. 4 is a diagram showing the configuration of the feeder as an example of the first embodiment of the disclosure. Further, FIG. 5 is a perspective view showing the configuration of a component supply tape used to supply the components. In this embodiment, two feeder type supplying mechanisms 40 are disposed side by side in the X-axis direction at each of both sides (upper and lower sides of FIG. 1) of the carrying conveyor 20, i.e. the feeder type supplying mechanisms 40 are disposed at a total of four positions. Each feeder type supplying mechanism 40 is configured by a collective replacing carriage having a plurality of feeders 50 detachably mounted in a row. Each feeder type supplying mechanism 40 is provided with a plurality of reel supporting portions (not shown), and component supply tapes 60 wound into a reel on the reel supporting portions can be sent to the feeders 50.

The component supply tape 60 is composed of a sheet-shaped carrier tape 62 long in one direction and a top tape 64 adhered to the carrier tape 62, for example, as shown in FIG. 5. Hollow component accommodating portions 62A open upward are provided at a fixed interval in a tape longitudinal direction in the carrier tape 62. The electronic components E1 are accommodated and held in the respective component accommodating portions 62A in a state closed by the top tape 64. Further, vertically penetrating engaging holes 62B are provided at a fixed interval along an edge part of one side of the carrier tape 62.

The component supply tape 60 thus configured is conveyed to a component supply position S1 by the operation of the feeder 50 in response to an operation command from the control unit 80 after being sent from the reel supporting portion and set in the feeder 50. In this way, the electronic component E1 accommodated in the component accommodating portion 62A can be supplied. In describing the configuration of the feeder 50, a side where the electronic component E1 is supplied (side facing toward the carrying conveyor 20, right side in FIG. 4) is referred to as a front side and an opposite side is referred to as a rear side for the sake of description. Further, a direction perpendicular to both a front-rear direction (Y-axis direction) and the vertical direction (Z-axis direction) of the feeder 50 is referred to as a width direction (X-axis direction) of the feeder 50.

The feeder type supplying mechanism 40 is provided with a feeder mounting unit 42, and a plurality of feeders 50 can be mounted in the feeder mounting unit 42 while being aligned in a row in the X-axis direction. Each feeder 50 is provided with two senders 52, 54 with respect to a main body 51 shaped to be long in the front-rear direction (Y-axis direction) as shown in FIG. 4 to send the component supply tape 60 holding the electronic components E1 toward the component supply position S1. Although a cover member 511 is mounted on the main body 51, the cover member 511 is cut to show the configurations of the both senders 52, 54 in FIG. 4.

Out of these, the sender 52 is a front sender provided on a front part of the main body 51 and includes a front motor 52A, a front gear group 52B composed of a plurality of gears, a front sprocket 52C disposed in an upper part of a front end of the main body 51, and an intermediate sprocket 52D. As shown in FIG. 3, the front motor 52A is electrically connected to the feeder control unit 59, and the feeder control unit 59 controls the drive of the front motor 52A in response to an operation command from the control unit 80. This causes the front motor 52A to operate in accordance with the above mounting program 83A. Then, power of the front motor 52A is transmitted to the front sprocket 52C and the intermediate sprocket 52D via the front gear group 52B to rotate the front sprocket 52C and the intermediate sprocket 52D. Teeth 52E to be engaged with the engaging holes 62B of the component supply tape 60 are formed at an equal interval on the outer periphery of this front sprocket 52C. Further, teeth 52F to be engaged with the engaging holes 62B of the component supply tape 60 are formed at an equal interval on the outer periphery of this intermediate sprocket 52D, similarly to the front sprocket 52C. The front sender 52 sends the component supply tape 60 sent from the rear sender 54 to the component supply position S1 in a front-end part of the feeder 50 by rotating the front sprocket 52C and the intermediate sprocket 52D with the teeth 52E of the front sprocket 52C engaged with the engaging holes 62B of the component supply tape 60. Further, an unillustrated exposing mechanism for exposing the electronic component E1 by cutting or peeling the top tape 64 of the component supply tape 60 moving between the intermediate sprocket 52D and the front sprocket 52C is provided between these sprockets.

The rear sender 54 includes a rear motor 54A, a rear gear group 54B composed of a plurality of gears, and a rear sprocket 54C disposed in an upper part of a rear end of the main body 51. The rear sender 54 is basically similarly configured to the front sender 52. Specifically, the rear motor 54A is electrically connected to the feeder control unit 59 as shown in FIG. 3, and the feeder control unit 59 controls the drive of the rear motor 54A in response to an operation command from the control unit 80. This causes the rear motor 54A to operate in accordance with the above mounting program 83A. Then, power of the rear motor 54A is transmitted to the rear sprocket 54C via the rear gear group 54B to rotate the rear sprocket 54C with teeth 54D of the rear sprocket 54C engaged with the engaging holes 62B of the component supply tape 60. In this way, the component supply tape 60 is sent to the front sender 52 via a tape path 56.

As just described, in this embodiment, the component supply tape 60 is set in the rear sender 54, sent to the front sender 52 by the rear sender 54 and further sent forward by the front sender 52, whereby the electronic components E1 accommodated in the component supply tape 60 can be conveyed to the component supply position S1. Further, as described above, with the teeth 52E of the front sprocket 52C engaged with the engaging holes 62B of the component supply tape 60, the electronic components E1 can be conveyed to the component supply position S1 only by the front sender 52 without the teeth 54D of the rear sprocket 54C being engaged with the engaging holes 62B of the component supply tape 60, i.e. in a free state. Further, the component supply tape 60 previously set in the feeder 50 (hereinafter, this is referred to as a "preceding tape 60A") can be sent only by the front sender 52, and a component supply tape 60 (hereinafter, this is referred to as a "succeeding tape 60B") set in the feeder 50 as a trailing end part of the preceding tape 60A approaches the feeder 50 as described later can be sent toward the front sender 52 by the rear sender 54. Specifically, in this embodiment, the front and rear senders 52, 54 are provided to enable the conveyance of the component supply tapes 60 in the following three modes.

First tape sending mode: One component supply tape 60 is sent to the front sender 52 by the rear sender 54, and this component supply tape 60 is sent to the component supply position S1 by the front sender 52.

Second tape sending mode: One component supply tape 60 is sent to the component supply position S1 only by the front sender 52.

Third tape sending mode: The succeeding tape 60B is sent to the front sender 52 by the rear sender 54 independently of the sending of the preceding 60A to the component supply position S1 only by the front sender 52.

Further, the main body 51 is provided with the tape path 56 from the rear sender 54 toward the front sender 52 as shown in FIG. 4 to enable the execution of the above three sending modes, and an introducing region 53 for introducing the component supply tape 60 to the tape path 56. Particularly, in this embodiment, the introducing region 53 conically spreads in the vertical direction Z from a position connected to the tape path 56 to a rear end part of the main body 51.

In this embodiment, a tip of a tape setting unit 55 including a pair of tape supporting members 551, 552 is provided to be insertable into and detachable from the introducing region 53. By inserting the tape setting unit 55 into the introducing region 53, the component supply tape 60 can be sent by the rear sender 54 while being supported from below by the tape supporting members 551, 552. Further, the component supply tape 60 is moved to a side below the introducing region 53 and set in a free state with respect to the rear sender 54 by the withdrawal (detachment) of the tape setting unit 55 from the introducing region 53 and the release of the support by the tape supporting members 551, 552. The configurations and operations of the tape setting unit 55 and a set moving mechanism 70 for moving the tape setting unit 55 are described below with reference to the drawings.

Figure 6A:
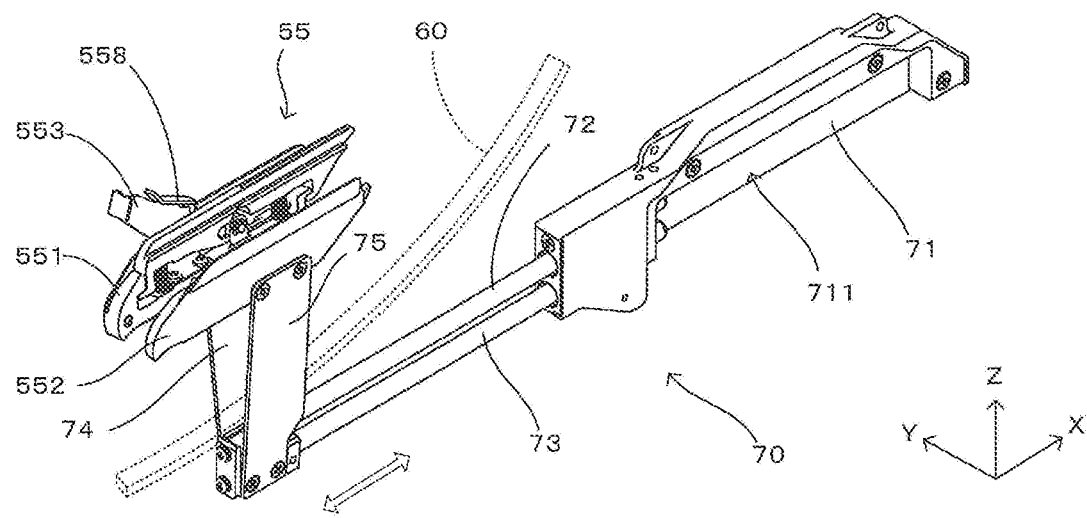
FIGS. 6A and 6B are perspective views showing overall configurations of the tape setting unit and the set moving mechanism.
Figure 6B:
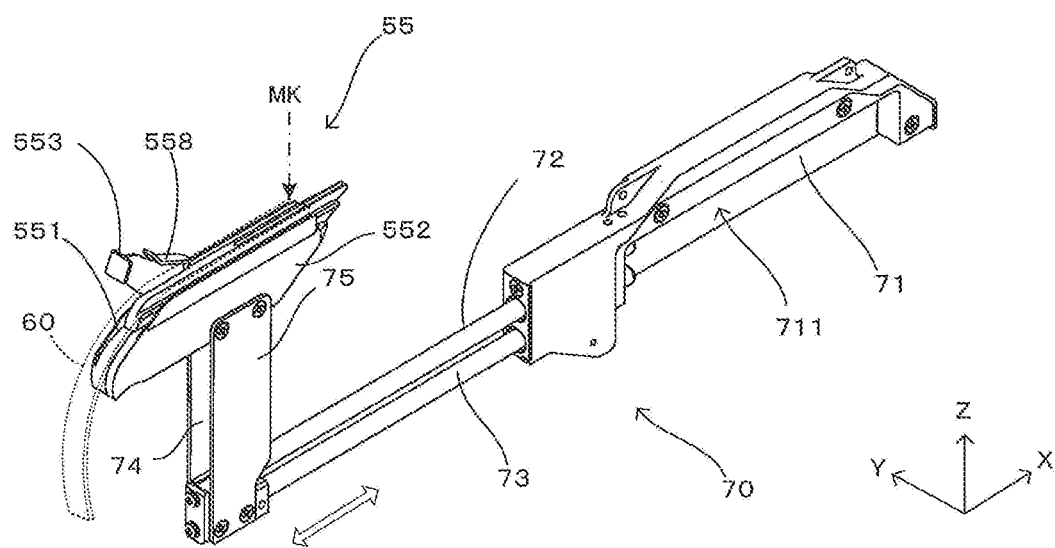
Figure 7A:
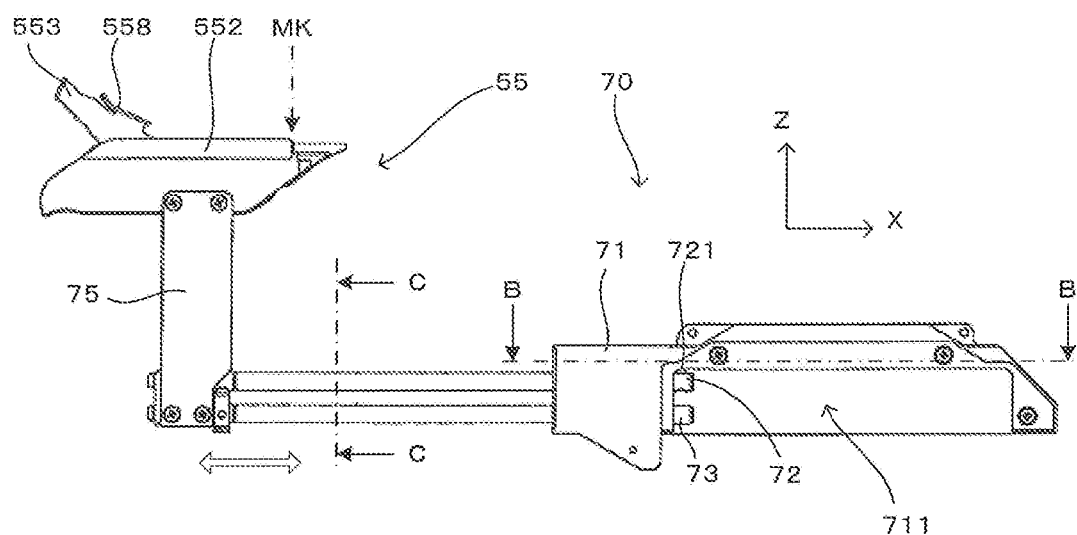
FIG. 7A is a side view of the tape setting unit and the set moving mechanism.
Figure 7B:
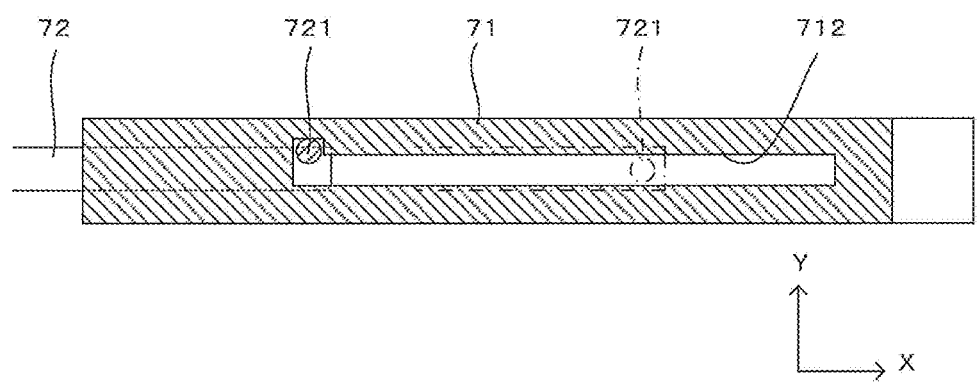
FIG. 7B is a sectional view along B-B in FIG. 7A.
Figure 7C:
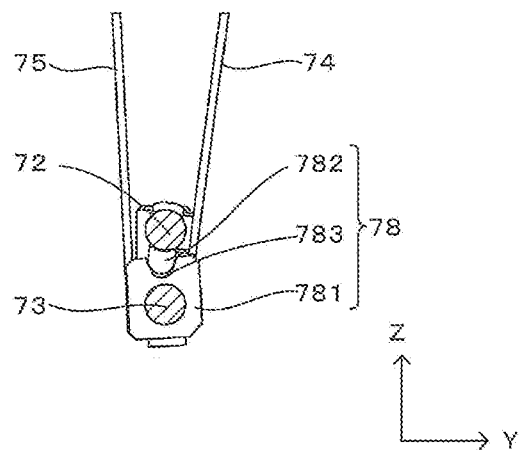
FIG. 7C is a sectional view along C-C in FIG. 7A.
Figure 7D:
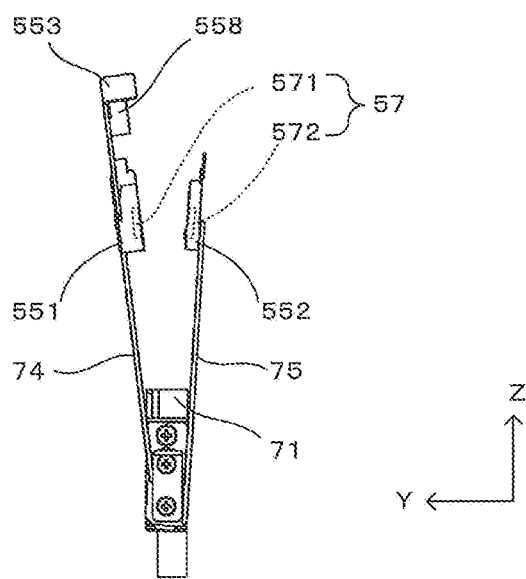
FIG. 7D is a view of the tape setting unit and the set moving mechanism viewed from behind in the X-axis direction.

FIGS. 6A and 6B are perspective views showing overall configurations of the tape setting unit and the set moving mechanism, wherein FIG. 6A shows a support released state where tape support is released and FIG. 6B shows a supported state where tape support is possible. Further, FIG. 7A is a side view of the tape setting unit and the set moving mechanism, FIG. 7B is a sectional view along B-B in FIG. 7A, FIG. 7C is a sectional view along C-C in FIG. 7A, and FIG. 7D is a view of the tape setting unit and the set moving mechanism viewed from behind in the X-axis direction (left side of FIG. 7A). The tape setting unit 55 is composed of the pair of tape supporting members 551, 552 arranged in a width direction (Y-axis direction) of the component supply tape 60 as described above. The set moving mechanism 70 is provided to integrally reciprocally move the tape supporting members 551, 552 in a longitudinal direction (X-axis direction) of the tape setting unit 55 and move the tape supporting members 551, 552 toward and away from each other.

As shown in FIG. 4, the set moving mechanism 70 includes a fixing portion 71 to be fixed to the main body 51, shaft members 72, 73 provided movably forward and backward along the X-axis direction on an opposite component supply position side (left side of FIG. 4) with respect to the fixing portion 71, and plate members 74, 75 rising upward from tip parts (end parts on the opposite component supply position side) of the shaft members 72, 73. A moving space 711 where the end parts of the shaft members 72, 73 on the component supply position side horizontally move extends in the X-axis direction in the fixing portion 71. Further, as shown in FIGS. 7A and 7B, a slit 712 extends in the X-axis direction to face the above moving space 711 in the fixing portion 71, and a projecting part 721 projecting upward from the end part of the shaft member 72 on the component supply position side is inserted. Further, this slit 712 is substantially L-shaped as shown in FIG. 7B and is bent at a right angle in the width direction (Y-axis direction) of the component supply tape 60 on the opposite component supply position side (left side of FIG. 7B) of the slit 712. Here, the slit 712 is finished to have a groove width slightly larger than an outer diameter of the projecting part 721, and the shaft member 72 is slidable in the X-axis direction while having a rotational movement restricted except at a bent part. Further, when the projecting part 721 reaches a bent part, a sliding movement of the shaft member 72 toward the opposite component supply position side is stopped there, whereas the shaft member 72 is rotatable about an axis of rotation parallel to the longitudinal direction in an angular range equivalent to an increase of the groove width at the bent part.

The other shaft member 73 is arranged rotatably about an axis of rotation extending in the longitudinal direction vertically below the shaft member 72, and an end part thereof on the opposite component supply position side (left side of FIG. 7B) is coupled to the end part of the shaft member 72 on the opposite component supply position side via a coupler 78. This coupler 78 includes a block member 781 fixed to the shaft member 73 and a projecting member 782 projecting from the shaft member 72 toward the block member 781 as shown in FIG. 7C. A lower end part of the projecting member 782 is finished into a substantially semispherical surface. Further, a recess 783 is formed in an upper surface of the block member 781 to correspond to the lower end part of the projecting member 782. By fitting the lower end part of the projecting member 782 into the recess 783 of the block member 781, the shaft members 72, 73 are coupled to each other.

Further, by configuring the coupler 78 as described above, the shaft members 72, 73 are rotatable in directions opposite to each other. When the shaft member 72 is rotated clockwise in the plane of FIG. 7C by the operation of an operator as described later, the projecting member 782 is displaced in the recess 783 of the block member 781 and the shaft member 73 rotates counterclockwise about the axis of rotation extending in the longitudinal direction X thereof together with the block member 781. When a rotational force is applied to one shaft member 72 by an external force in this way, the other shaft member 73 rotates in an opposite direction in conjunction, the plate members 74, 75 standing in parallel to each other are opened in a hinged manner with the coupler 78 as a center, and the tape supporting members 551, 552 respectively secured to upper end parts of the plate members 74, 75 move in the width direction Y of the component supply tape 60 away from each other to release tape support as shown in FIG. 6A. On the other hand, if an external force is applied to the shaft member 72 in an opposite direction, the plate members 74, 75 opened in a hinged manner by the rotational force opposite to the above force return to parallel postures and the tape supporting members 551, 552 are integrated to return to a state where the tape can be supported. The above external force means a force applied by the operator to the tape supporting members 551, 552 and the lever member 553 coupled to the tape supporting member 551. Further, when the plate members 74, 75 are closed to be parallel to each other, an interval between the plate members 74, 75 is wider than a width of the component supply tape 60, so that the plate members 74, 75 can smoothly move when the component supply tape 60 is located below the tape supporting members 551, 552.

As just described, the tape supporting members 551, 552 can be switched between a supporting state (FIG. 6B) where the tape supporting members 551, 552 are integrated to support the component supply tape 60 from below and a non-supporting state (FIG. 6A) where the tape supporting members 551, 552 are separated to release the support of the component supply tape 60 when the tape supporting members 551, 552 are separated from the introducing region 53 while being guided by the set moving mechanism 70. The tape supporting members 551, 552 have a substantially symmetrical structure except for the presence or absence of the lever member 553. Thus, the tape supporting member 551 having the lever member 553 coupled thereto is described below, whereas the same structural components are denoted by the same reference signs and not described for the tape supporting member 552.

Figure 8A:
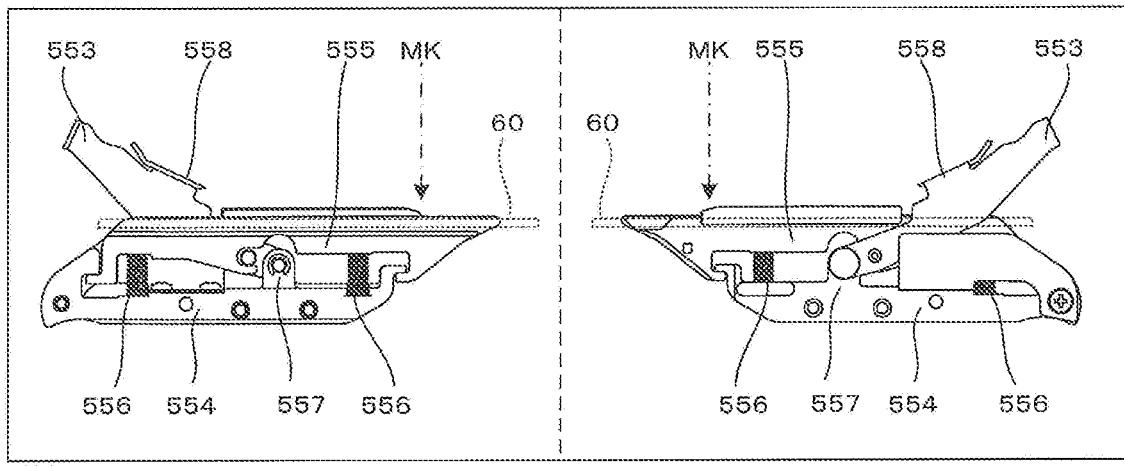
FIG. 8A is a view showing the tape supporting member when tape clamping by the lever member is released.
Figure 8B:
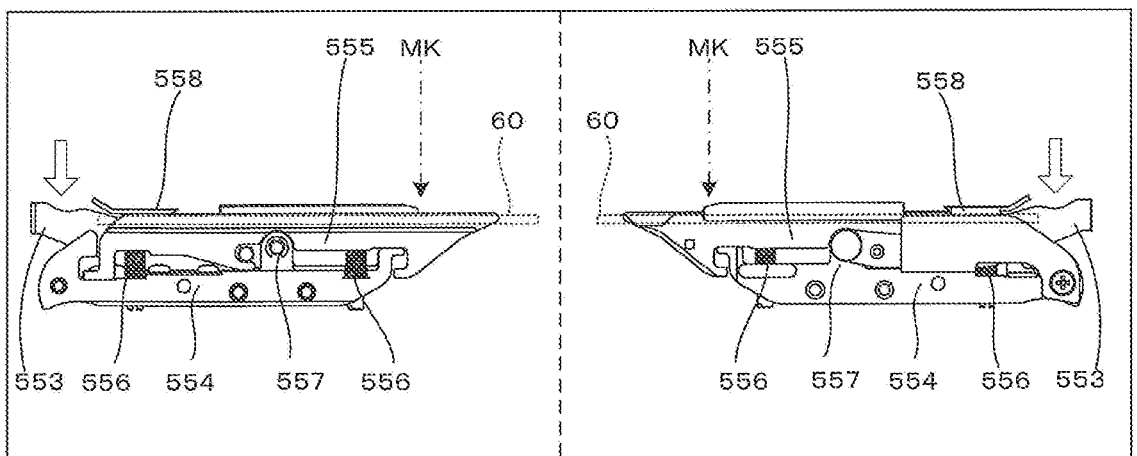
FIG. 8B is a view showing the tape supporting member when tape clamping by the lever member is performed.
Figure 9A:
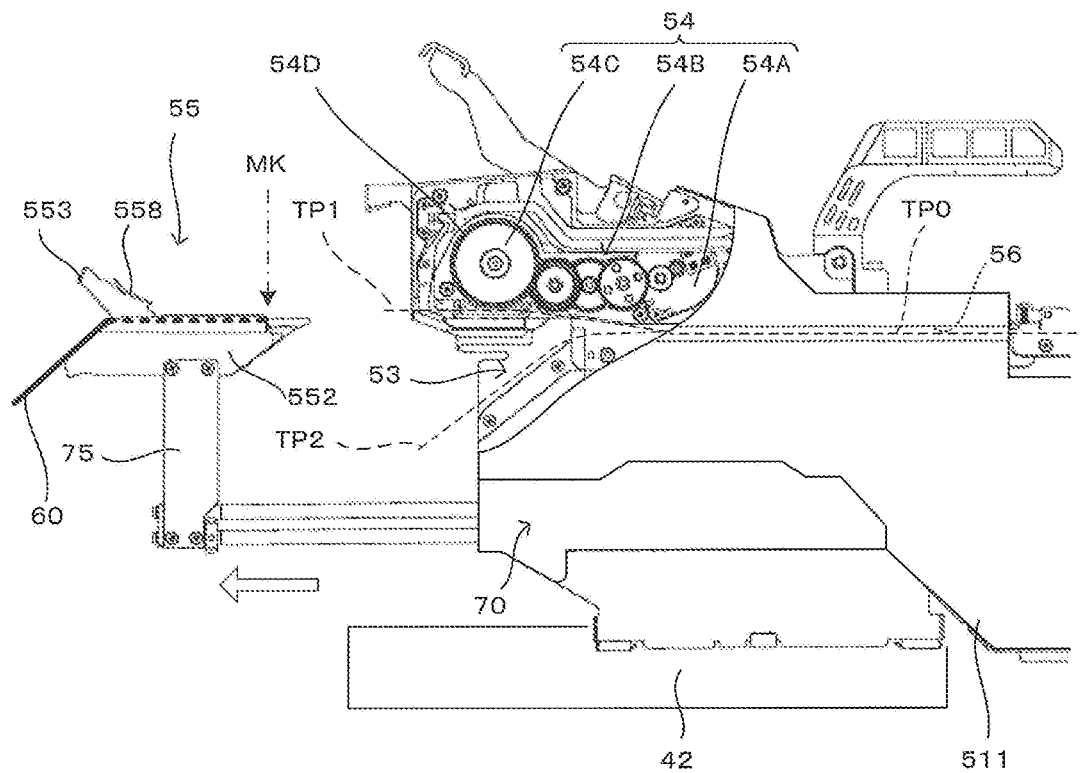
FIGS. 9A to 9F are diagrams schematically showing the procedure of mounting the component supply tape into the feeder.
Figure 9B:
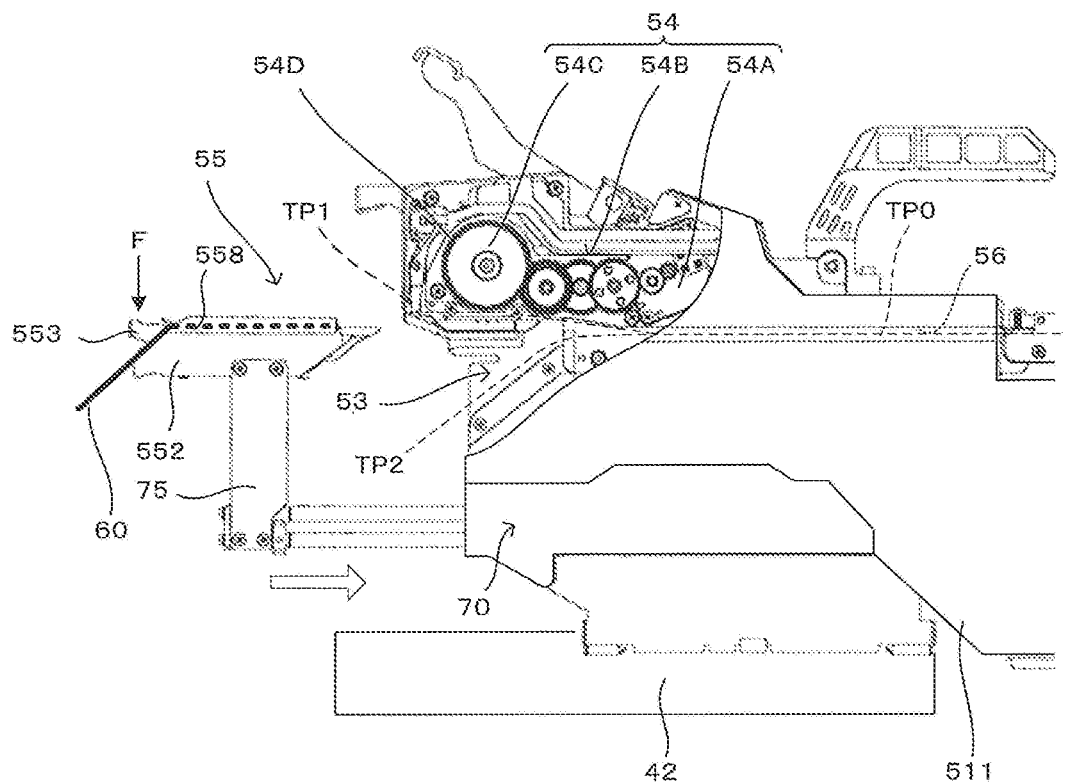

FIG. 8A is a view showing the tape supporting member when tape clamping by the lever member is released, and FIG. 8B is a view showing the tape supporting member when tape clamping by the lever member is performed. In each figure, a view viewed from one side in the Y-axis direction and a view viewed from the other side are drawn in parallel. The tape supporting member 551 includes a base member 554 fixed to an upper end part of the plate member 76, a movable member 555 arranged movably in the vertical direction Z above the base member 554, and a spring member 556 arranged between the upper surface of the base member 554 and the lower surface of the movable member 555 and configured to bias the movable member 555 upward with respect to the base member 554. Out of these, the upper surface of the movable member 555 serves as a tape supporting surface for supporting one end part of the component supply tape 60 in the width direction Y from below. Specifically, the component supply tape 60 is supported by placing the lower surface (corresponding to "one principal surface" of the disclosure) of one end part (corresponding to an example of a "supported part") of the component supply tape 60 on the movable member 555. Further, the movable member 555 is biased upwardly, i.e. in a normal direction to the upper surface (corresponding to "the other principal surface" of the disclosure) of the component supply tape 60, by the spring member 556, and a contact wall slightly rising upward is formed on the upper surface of this movable member 555 to restrict the component supply tape 60 in the width direction. Note that specifically, a contact wall rising slightly upward is formed on the upper surface of the movable member 555 to restrict the component supply tape 60 in the width direction. A contact wall is also formed on a movable member 555 of the tape supporting member 552 and, when the pair of tape supporting members 551, 552 are in the supporting state as described later, end parts of the lower surface of the component supply tape 60 in the width direction Y are supported from below in upper surface areas of the respective tape supporting members 551, 552 sandwiched between the both contact walls. An interval between the both contact walls is larger than a dimension of the component supply tape 60 in the width direction and can effectively prevent the component supply tape 60 from being displaced in the width direction and detached from the tape setting unit 55. Further, in a state where the tape supporting members 551, 552 are closed and held in contact to support the component supply tape 60, the surfaces for supporting the component supply tape 60 are set to form substantially no clearance between the both tape supporting members 551, 552. Even in a state where the tape setting unit 55 is set in the main body 51 as shown in FIG. 9F, the lever member 553 can be pushed down to insert and fit the component supply tape 60 to the sprocket 54C. At this time, since there is no clearance between the surfaces of the tape supporting members 551, 552 supporting the component supply tape 60, the component supply tape can be easily inserted along those surfaces.

Further, a shaft supporting part 557 projects in a central part of the upper surface of the base member 554, and pivotally supports one end part of the lever member 553. On this one end part of the lever member 553, a pin projects in the Y-axis direction at a position slightly displaced toward the other end part from a shaft supporting position and is locked to a part of the movable member 555. Further, a clamp plate 558 projects in the Y-axis direction toward the upper surface (tape supporting surface) of the movable member 555 in a central part of the lever member 553. Thus, when no external force acts on the lever member 553, the movable member 555 is pressed upward by a biasing force of the spring member 556 to move to a position shown in FIG. 8A. Further, the lever member 553 rotates according to this movement and the other end part of the lever member 553 is in a posture to stand oblique upward. Furthermore, the clamp plate 558 is in a so-called unclamping state to be separated from the tape supporting surface of the movable member 555 and not to clamp the component supply tape 60.

On the other hand, as indicated by a white arrow in FIG. 8B, if the operator pushes down the other end part of the lever member 553 against the biasing force of the spring member 556, the lever member 553 is rotated about the above shaft supported part to push down the movable member 555. Further, a so-called clamped state is set where the clamp plate 558 is located at a clamping position to come into contact with the component supply tape 60 and vertically clamps the component supply tape 60 in cooperation with the movable member 555. If the operator releases the lever member 553 from this state, return is made to the unclamped state by the biasing force of the spring member 556 (FIG. 8A). In this way, the clamp plate 558 functions as a clamping member capable of pressing the component supply tape 60 against the tape supporting member 551.

Further, the lever member 553 has a support switching function of switching the tape setting unit 55 between a tape supporting state and a support releasing state where the tape supporting state is released by receiving an external force in the Y-axis direction besides a clamp switching function of switching between the clamping state and the unclamping state. That is, if the operator applies a force in a direction to move the lever member 553 toward the tape supporting member 552 (direction toward a right-lower side in FIG. 6A) out of the Y-axis directions with the entire tape setting unit 55 pulled out from the main body 51 as shown in FIGS. 6A and 6B, the tape supporting member 551 is located at a position below the one end part of the component supply tape 60 in the width direction Y (corresponding to a "first supporting position" of the disclosure) as shown in FIG. 6B to support the one end part of the component supply tape 60 from below. Further, in conjunction with the movement of the tape supporting member 551, the tape supporting member 552 is located at a position below the other end part of the component supply tape 60 (corresponding to a "second supporting position" of the disclosure) as shown in FIG. 6B to support the other end part of the component supply tape 60 from below. Since the pair of tape supporting members 551, 552 are proximate to each other and support the component supply tape 60 in this way, i.e. are in the tape supporting state, the component supply tape 60 can be stably supported.

Further, in this embodiment, a coupler 57 is provided to stabilize the tape supporting state. This coupler 57 is composed of a magnet 571 secured to the base member 554 of the tape supporting member 551 and a magnet 572 secured to the base member 554 of the tape supporting member 552 as shown in FIG. 7D, and couples the tape supporting members 551, 552 to each other by a magnetic attraction force generated between the both magnets 571, 572 proximately facing each other in the tape supporting state. A magnetic attraction force may be generated with either one of the magnets replaced by a magnetic body.

If the operator applies a force larger than the above magnetic attraction force in a direction to separate the lever member 553 from the tape supporting member 552 (direction toward a left-upper side in FIG. 6B) out of the Y-axis directions, the tape supporting member 551 moves to a first non-supporting position separated from the first supporting position in a direction toward a side opposite to the tape supporting member 552 out of the Y-axis directions. Further, in conjunction with the above movement, the tape supporting member 552 is moved by the set moving mechanism 70 to a second non-supporting position separated from the second supporting position in a direction toward a side opposite to the tape supporting member 551 out of the Y-axis directions. In this way, the pair of tape supporting members 551, 552 are retracted from the positions below the component supply tape 60, thereby releasing the support of the component supply tape 60.

As just described, in this embodiment, three operations, i.e.
- a switching operation of setting and releasing the tape supporting state;
- an inserting/detaching operation of the tape setting unit 55 into and from the introducing region 53;
- a switching operation of switching between the clamping state and the unclamping state;

can be simultaneously performed in parallel by a one-touch operation of the lever member 553 by the operator, whereby excellent operability is obtained.

Next, an operation of mounting a new component supply tape 60 into the feeder 50 having no component supply tape 60 mounted therein yet and supplying components and an operation of setting a succeeding tape 60B during the supply of the components by a preceding tape 60A and preparing for the next tape switch in the surface mounting machine 1 configured as described are described with reference to FIGS. 9A to 9F.

FIGS. 9A to 9F are diagrams schematically showing the procedure of mounting the component supply tape into the feeder. Broken line TP0 in these figures indicates a sending route in which the component supply tape 60 is sent to the component supply position S1 along the tape path 56. Further, broken line TP1 indicates a sending route which is formed in an upper space of the introducing region 53 by the insertion of the tape setting unit 55 into the introducing region 53 and in which the component supply tape 60 is sent to the tape path 56 and, in this embodiment, this sending route is sloped downward toward the tape path 56. Furthermore, broken line TP2 indicates a sending route which is formed in a lower space of the introducing region 53 and in which the component supply tape 60 is sent to the tape path 56 only by the front sender 52.

In the case of setting a component supply tape 60 into one empty feeder 50 out of the plurality of feeders 50 mounted in the feeder mounting unit 42, the following manual operation is performed by the operator. First, as shown by a white arrow of FIG. 9A, the tape setting unit 55 of this feeder 50 is pulled out from the introducing region 53 and detached from the main body 51 with the feeder 50 mounted in the feeder mounting unit 42. In this detached state, the component supply tape 60 is sent from the reel supporting portion (not shown), and the tip of the component supply tape 60 is aligned with a mark MK provided on a tip part of the tape setting unit 55 and placed on the upper surfaces of the pair of tape supporting members 551, 552 coupled to each other by the coupler 57. In this embodiment, stepped parts provided on the upper surfaces of the respective movable members 555, more specifically end surface positions of the contact walls on the side of the component supply position S1 are set as the mark MK. When the tape setting unit 55 is inserted into the introducing region 53, the mark MK can reach a position slightly beyond the rear sprocket 54C and the leading end part of the component supply tape 60 can be located at a position right below the rear sprocket 54C. This enables the teeth 54D of the rear sprocket 54C to be stably engaged with the engaging holes 62B of the component supply tape 60 and a length of a leading end part of the component supply tape 60 inserted into the main body 51 to be set at a fixed value. As just described, the mark MK functions as an index part indicating the leading end position in the longitudinal direction of the leading end part (supported part) of the component supply tape 60 supported by the tape setting unit 55, and the set position and set length of the component supply tape 60 with respect to the tape setting unit 55 can be easily constantly kept constant. A structure other than the stepped parts may be used as the mark MK. Further, the mark MK may be newly added to the tape setting unit 55.

When the component supply tape 60 is placed in this way, the both end parts of the component supply tape 60 in the width direction Y are supported from below by the tape supporting members 551, 552. Subsequent to this, as indicated by an arrow F in FIG. 9B, the component supply tape 60 is clamped by the clamp plate 558 and the movable member 555 by pressing down the lever member 553, and the tape setting unit 55 is moved toward the introducing region 53 with that clamping state maintained. As just described, in this embodiment, a so-called presetting process of the component supply tape 60 is performed to position and clamp the component supply tape 60 at a predetermined position by the tape setting unit 55 before the component supply tape 60 is inserted into the main body 51 of the feeder 50.

Figure 9C:
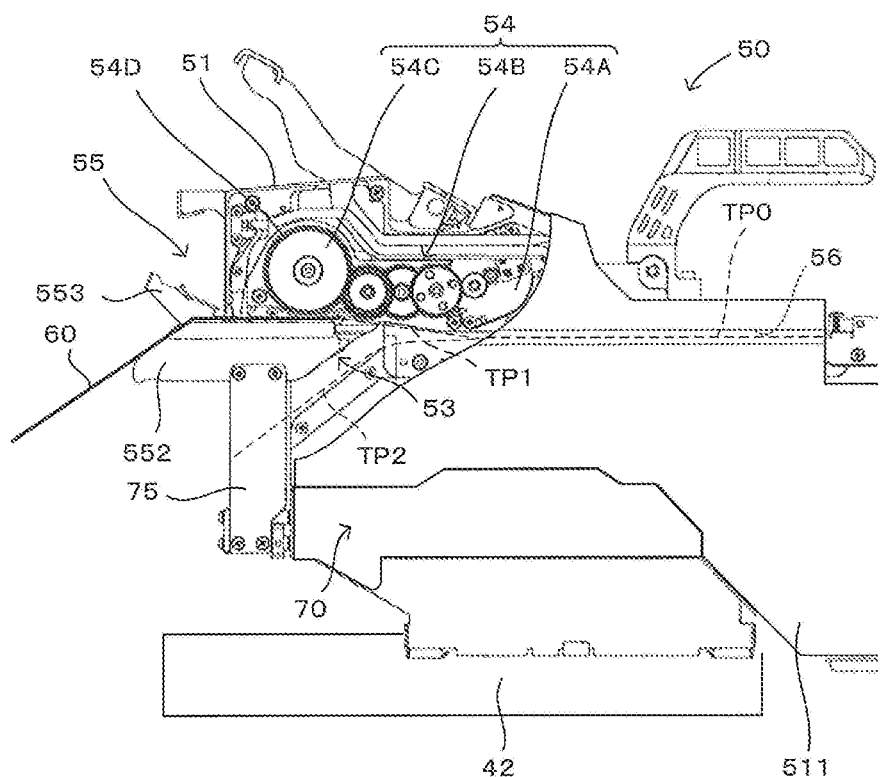

When the tape setting unit 55 having the component supply tape 60 preset therein is inserted into the introducing region 53, the leading end part of the component supply tape 60 is positioned at the position right below the rear sprocket 54C as shown in FIG. 9C. Subsequent to this, when the press-down of the lever member 553 is released, the movable members 555 are moved upward by biasing forces of the spring members 556 to press the leading end part of the component supply tape 60 against the rear sprocket 54C. In this way, the teeth 54D of the rear sprocket 54C are engaged with the engaging holes 62B of the component supply tape 60 and the lower surface of the component supply tape 60 is elastically supported by the movable members 555. Thus, the component supply tape 60 can be stably sent by the rear sender 54 while the application of a pressure exceeding the biasing forces of the spring members 556 to the component supply tape 60 is prevented.

Figure 9D:
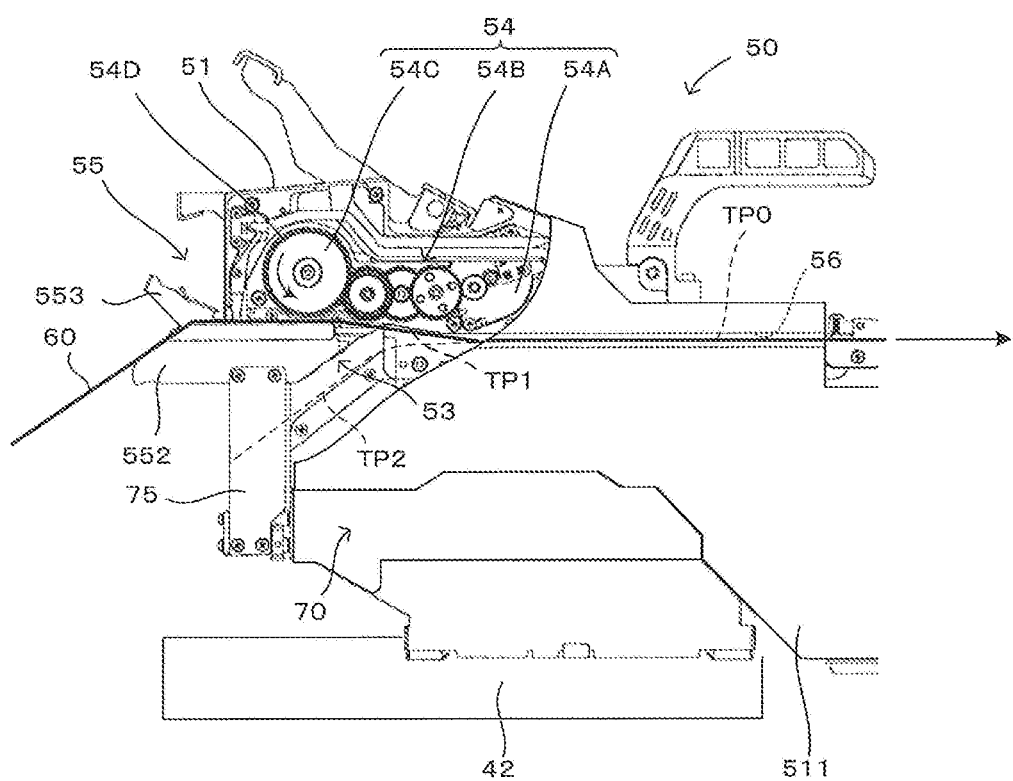

When the preparation to send the component supply tape 60 by the rear sender 54 is completed in this way and the operator gives a setting command to the control unit 80 via the input unit 89, the control unit 80 drives the rear motor 54A in response to that command to rotate the rear sprocket 54C, send the leading end part of the component supply tape 60 to the front side of the feeder 50 and engage the tip part with the teeth 52E of the front sprocket 52C (first sending step) as shown in FIG. 9D.

When the preparation to supply the components is completed in this way, the control unit 80 controls each part of the surface mounting machine 1 in accordance with the aforementioned mounting program 83A to supply the electronic components E1 from the feeders 50 and mount the electronic components E1 on the surface of the printed board P1 by the head unit 32. Although the above first sending step and component mounting based on the mounting program 83A are differently performed, it goes without saying that the first sending step may be incorporated into the mounting program 83A.

As just described, since the component supply tape 60 is set in the main body 51 of the feeder 50 using the tape setting unit 55 in this embodiment, the component supply tape 60 can be easily introduced into the main body 51 without being deformed. In addition, since the presetting process is performed utilizing the mark MK provided on the tape setting unit 55, the component supply tape 60 can be stably introduced.

While the electronic components E1 are being supplied, the feeder 50 continues to send the component supply tape 60 to the component supply position S1 and the remainder of the component supply tape 60 becomes less in the meantime. Accordingly, while the component supply tape 60 continues to be intermittently sent to the component supply position S1, the operator sets the next component supply tape 60, i.e. the succeeding tape 60B by the following manual operation until the supply of the components by the preceding tape 60A, which is the above component supply tape 60, is finished.

Figure 9E:
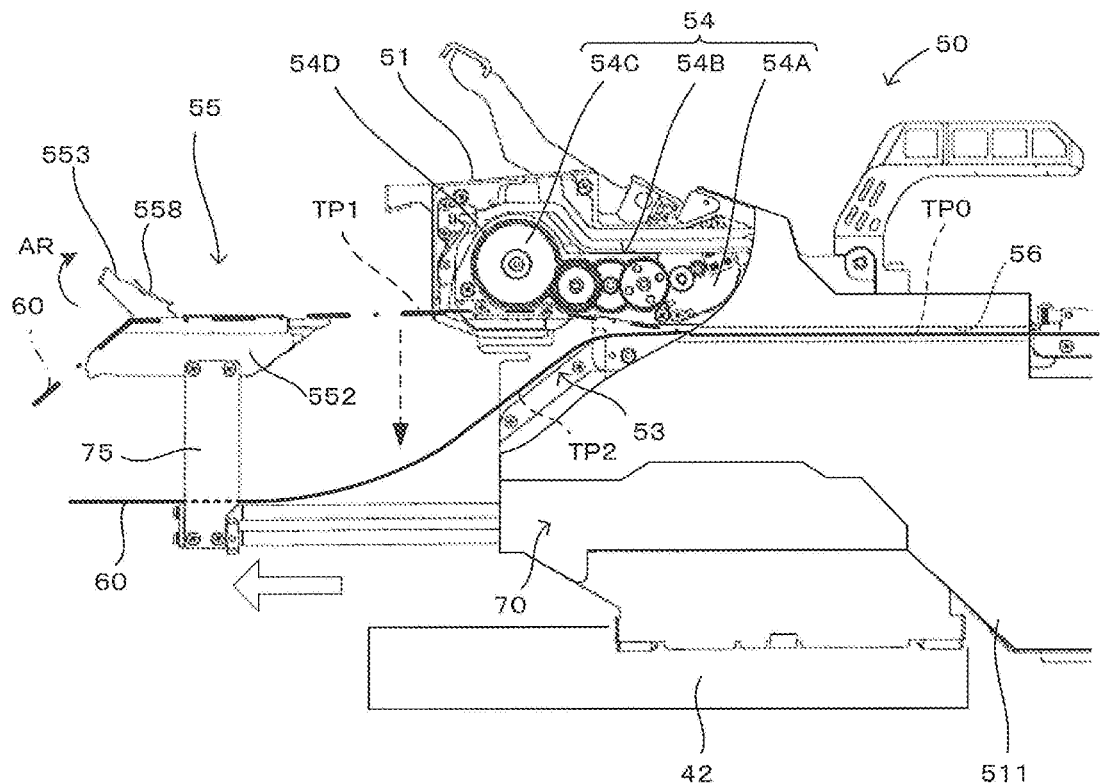
Figure 9F:
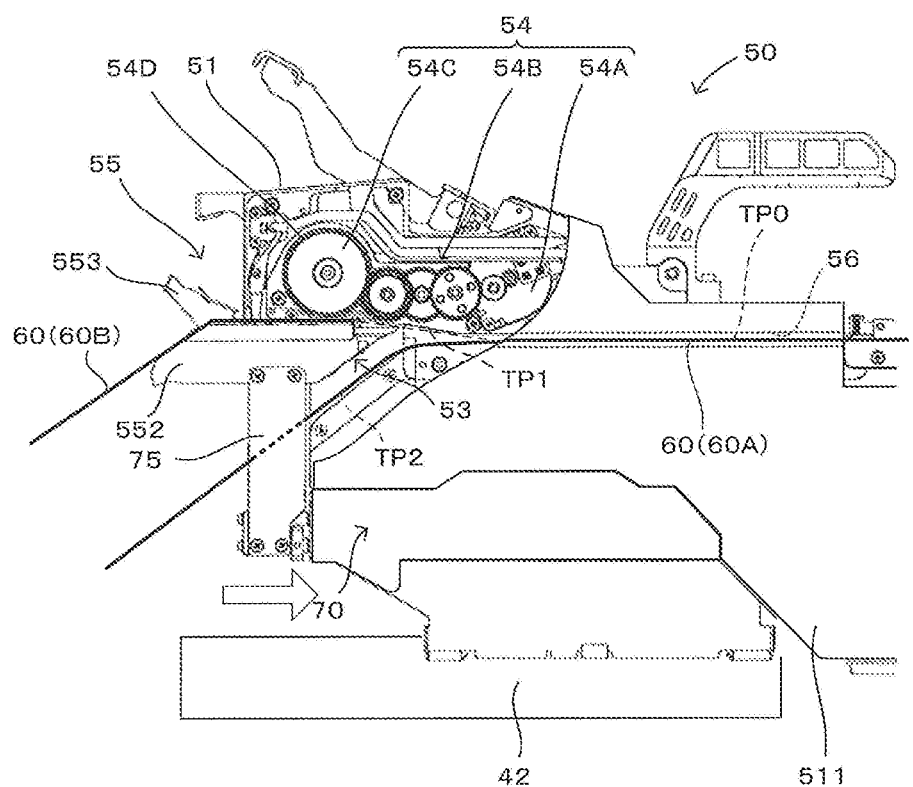

In a state where the preceding tape 60A continues to be sent to the component supply position S1, the tape setting unit 55 is pulled out from the introducing region 53 as indicated by a white arrow of FIG. 9E and detached from the main body 51. Subsequent to that, a force is applied in a direction to separate the lever member 553 from the tape supporting member 552 out of the Y-axis directions, thereby moving the tape supporting members 551, 552 respectively to the "first non-supporting position" and the "second non-supporting position" as indicated by an arrow AR in FIG. 9E. That is, the pair of tape supporting members 551, 552 are simultaneously retracted from the positions below the component supply tape 60 to release the support of the component supply tape 60. In this way, the preceding tape 60A moves vertically downward in the introducing region 53 by the own weight thereof and is separated from the rear sprocket 54C, and the sending route for the preceding tape 60A is switched from the sending route TP1 to the sending route TP2 in the introducing region 53 (tape position switching step). At this time, the preceding component supply tape 60A is already engaged with the front sprocket 52C, wherefore the preceding tape 60A can continue to be sent to the component supply position S1 by rotating the front sprocket 52C even if being separated from the rear sprocket 54C (second sending step).

When a downward movement of the preceding tape 60A in the introducing region 53 is completed, the lever member 553 is returned to an initial position, the pair of tape supporting members 551, 552 are coupled to each other and integrated, the succeeding tape 60B is introduced into the introducing region 53 as in the setting operation of the preceding tape 60A (a series of operations shown in FIGS. 9A to 9C), the teeth 54D of the rear sprocket 54C are engaged with the engaging holes 62B of the component supply tape 60, and the lower surface of the component supply tape 60 is elastically supported by the movable members 555, thereby completing the setting of the succeeding tape 60B.

Thereafter, when an unillustrated tape sensor detects the passage of a trailing end part of the preceding 60A through the tape path 56, the feeder control unit 59 having taken in that detection signal drives the rear motor 54A to rotate the rear sprocket 54C. In this way, a leading end part of the succeeding tape 60B is sent to the front side of the feeder 50 and engaged with the front sprocket 52C.

In this embodiment, when the absence of the preceding tape 60A in the tape path 56 is detected by the tape sensor, the feeder control unit 59 rotationally drives the rear motor 54A at a speed faster than the front motor 52A for a predetermined time. In this way, the succeeding tape 60B is sent faster than the preceding tape 60A for the predetermined time, whereby the leading end part of the succeeding tape 60B approaches the trailing end part of the preceding tape 60A.

The aforementioned predetermined time is calculated and set in advance as follows. Specifically, in this embodiment, the front motor 52A is rotated at a constant speed and the control unit 80 can calculate a time until the leading end part of the succeeding tape 60B reaches the trailing end part of the preceding tape 60A from a sending speed of the component supply tape 60 by the front motor 52A and a distance between the tape sensor and the rear sprocket 54C and set the calculated time as the above predetermined time.

As described above, according to the first embodiment, the leading end part (supported part) of the component supply tape 60 is supported by the tape setting unit 55 and the tape setting unit 55 is inserted into the introducing region 53 of the main body 51 with a rear end side (lever member side) of the supported part clamped by the clamp plate 558 as shown in FIG. 8B, whereby the component supply tape 60 is introduced into the introducing region 53. Thus, the component supply tape 60 is inserted into the main body 51 while being constantly supported on the tape setting unit 55, wherefore the component supply tape 60 can be easily and stably inserted into the main body 51 without being deformed, regardless of the work posture of the operator, the presence or absence of a blind spot and the like.

Further, in the above embodiment, the mark MK is provided on the tape setting unit 55 and a so-called presetting process of keeping the leading end position of the component supply tape 60 and a tape length in the introducing region 53 constant when the component supply tape 60 is introduced into the main body 51 is performed utilizing the mark MK. Thus, when the insertion of the tape setting unit 55 into the introducing region 53 is completed, the leading end part of the component supply tape 60 is positioned at a position set in advance with respect to the rear sprocket 54C and the component supply tape 60 can be reliably sent by the sending portion 54 by stably engaging the engaging holes 62B of the component supply tape 60 with the teeth 54D of the rear sprocket 54C.

Further, the following functions and effects are obtained by performing the presetting process in this way. Unless the presetting process is performed, a sensor for detecting the arrival of the leading end part of the component supply tape 60 at a predetermined position is provided and the operator needs to manually send the component supply tape 60 to the main body 51 while monitoring sensor detection. In contrast, according to this embodiment, the installation of a sensor is unnecessary. Further, the tape setting unit 55 may be inserted into the introducing region 53 of the main body 51 after the above presetting process is performed in a space distant from the main body 51 as shown in FIGS. 9A and 9B, wherefore the workability of the operator can be drastically improved. Particularly, in the surface mounting machine 1 in which the plurality of feeders 50 are adjacently mounted in the feeder mounting units 42, the above functions and effects are notable.

Further, by releasing the hold of the component supply tape 60 by the clamp plate 558 after the introducing operation of the component supply tape 60 is completed, the component supply tape 60 is pressed toward the rear sprocket 54C by the movable members 555 with a force corresponding to biasing forces of the spring members 556. In this way, the component supply tape 60 can be stably sent.

Further, since the structure for inserting and detaching the tape setting unit 55 into and from the main body 51 of the feeder 50 is adopted as described above, the tape setting unit 55 may be possibly lost when being detached from the main body 51 if the tape setting unit 55 is independent of the main body 51. However, since the tape supporting members 551, 552 are coupled to the main body 51 by the set moving mechanism 70 in this embodiment, the above loss can be reliably prevented.

Figure 10:
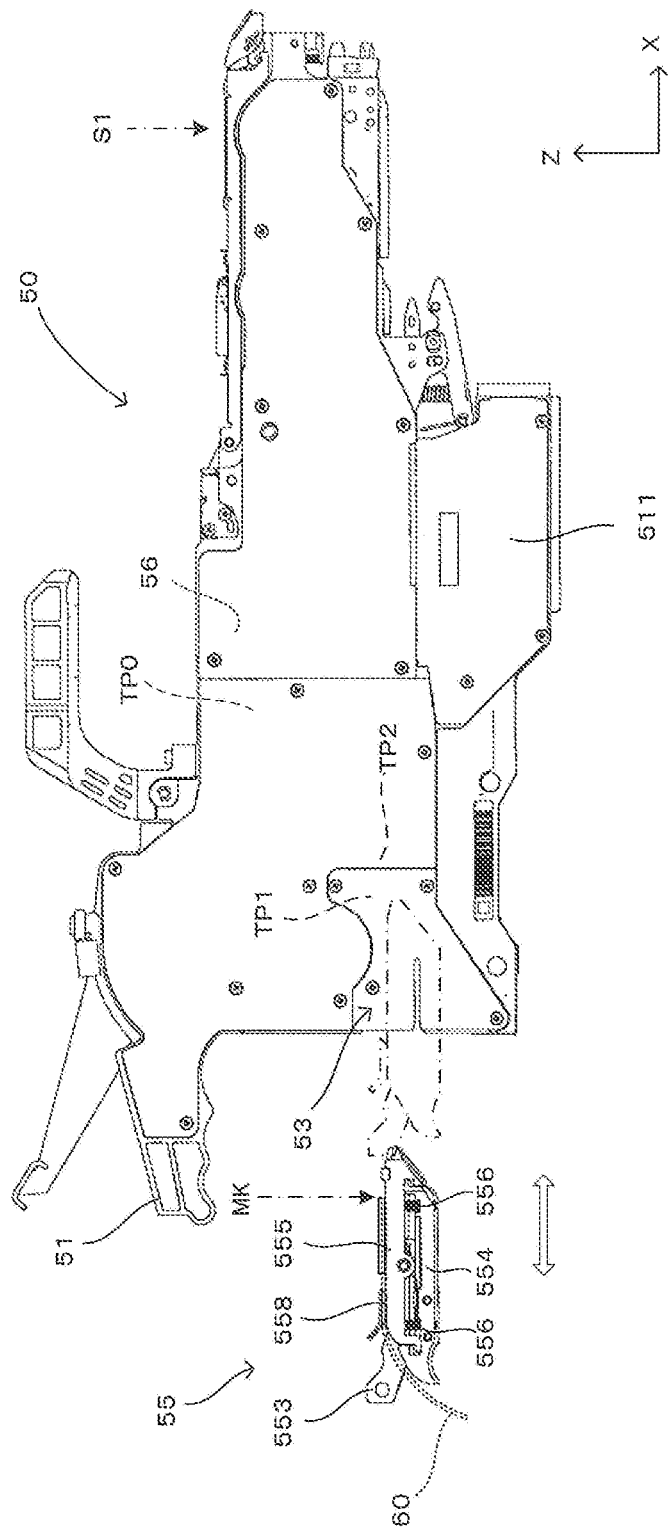
FIG. 10 is a side view showing a component supply device according to a second embodiment of the disclosure.
Figure 11:
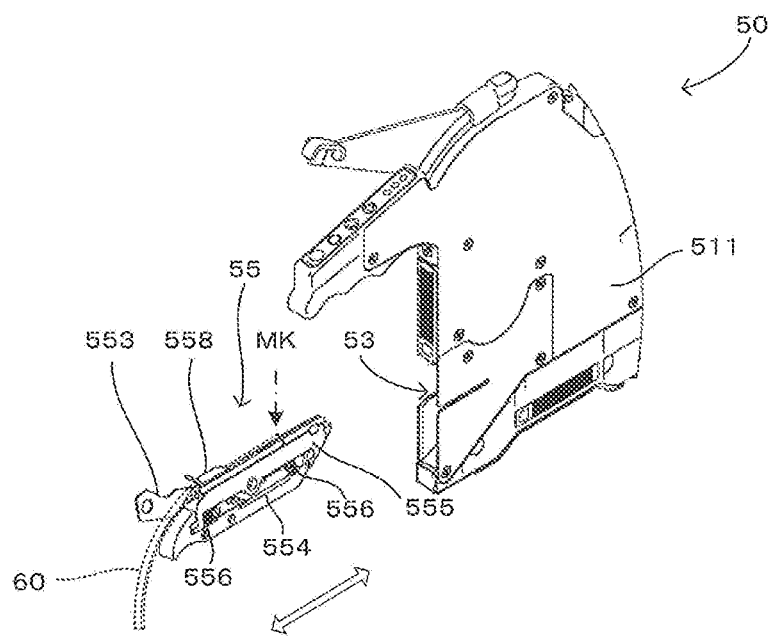
FIG. 11 is a partial perspective view of the component supply device shown in FIG. 10.

FIG. 10 is a side view showing a component supply device according to a second embodiment of the disclosure. Further, FIG. 11 is a partial perspective view of the component supply device shown in FIG. 10. This second embodiment largely differs from the first embodiment in that a tape setting unit 55 is configured by integrating tape supporting members 551, 552, the tape setting unit 55 is independently inserted into and detached from an introducing region 53 of a main body 51 without using the set moving mechanism 70 and a component supply tape 60 is moved from a sending path TP1 to a sending path TP2 by withdrawing the tape setting unit 55 from the main body 51. The other configuration and operation are basically similar to those of the first embodiment. Thus, the following description is centered on points of difference and the same components and operations are denoted by the same or corresponding reference signs and not described.

In this second embodiment, the tape setting unit 55 includes a base member 554, a movable member 555 arranged movably in a vertical direction Z above the base member 554 and a spring member 556 arranged between the upper surface of the base member 554 and the lower surface of the movable member 555 and is separately and independently inserted into and detached from the main body 51. The movable member 555 has a tape supporting surface wider than a width of the component supply tape 60 in a width direction Y. Note that contact walls (not shown) are provided to stand at an interval slightly wider than the tape width from this tape supporting surface, and an end surface position of each contact wall on the side of a component supply position S1 is provided as a mark MK as in the first embodiment. Further, as in the first embodiment, a lever member 553 and a clamp plate 558 are provided on the tape setting unit 55.

In this second embodiment, the component supply tape 60 is set in a feeder 50 in an empty state by a manual operation similar to that of the first embodiment, and a succeeding tape 60 is set into the feeder 50 as follows. Specifically, the tape setting unit 55 is pulled out from the introducing region 53 as indicated by a white arrow in FIGS. 10 and 11 in a state where a preceding tape continues to be sent to the component supply position S1, and independently separated from the main body 51. Although the component supply tape (preceding tape) 60 is supported from below by the tape setting unit 55 inserted into the introducing region 53 before this pull-out operation, this support is released by the pull-out operation and the component supply tape 60 moves vertically downward in the introducing region 53 by the own weight thereof. That is, a sending path for the preceding 60 in the introducing region 53 is switched from the sending path TP1 to the sending path TP2.

Further, a presetting process of the succeeding tape 60 is performed for the tape setting unit 55 pulled out from the main body 51 in this way. That is, after a leading end part (supported part) of the succeeding tape 60 is placed on the upper surfaces of the movable members 555 to support the tape setting unit 55 from below while the leading end of the succeeding tape 60 is aligned with the marks MK, the lever member 553 is pushed down to clamp the leading end part of the succeeding tape 60 by the clamp plate 558 and the movable members 555. Then, the tape setting unit 55 is inserted into the introducing region 53 of the main body 51, whereby the succeeding tape 60 is completely set.

As described above, since the preset tape setting unit 55 is inserted into the introducing region 53 of the main body 51 to set the component supply tape 60 in the second embodiment, the component supply tape 60 can be reliably sent by a sending portion 54 as in the first embodiment. Further, since the above presetting process is performed with the tape setting unit 55 pulled out and completely separated from the main body 51 in the second embodiment, the above presetting process can be performed not only at a position near the main body 51, but also at a position distant from the main body 51, and the operability of the presetting process can be enhanced.

As described above, in the above embodiments, the electronic component E1 corresponds to an example of a "component" of the disclosure, and the feeder 50 corresponds to an example of a "component supply device" of the disclosure. Further, the tape supplying unit 55 and the set moving mechanism 70 respectively correspond to examples of a "tape supporter" and a "mover" of the disclosure. The lever member 553 and the clamp plate 558 respectively correspond to examples of a "switcher" and a "clamping member" of the disclosure and these function as a "clamping mechanism" of the disclosure. Further, the movable member 555 corresponds to an example of a "supporting member" of the disclosure. Further, the spring member 556 corresponds to an example of a "biasing member" of the disclosure. Further, the mark MK corresponds to an example of an "index part" of the disclosure. Furthermore, the presetting process corresponds to an example of an "introducing step" of the disclosure.

The disclosure is not limited to the above embodiments and various changes can be made on the above embodiments without departing from the gist of the disclosure. For example, although the pair of tape supporting members 551, 552 are both opened by the two shaft members 72, 73 and the coupler 78 as shown in FIG. 7C in the above first embodiment, the double opening structure is not limited to this and a conventionally known double opening structure may be used. For example, the shaft members 72, 73 may be double tubes arranged one inside the other.

Further, in the above embodiments, if the manual operation of the lever member 553 is stopped, e.g. the operator releases the lever member 553, the lever member 553 is returned to the initial position and return is made from the clamping state (FIG. 8B) to the unclamping state (FIG. 8A) by the biasing forces of the spring members 556. Here, a latch mechanism may be incorporated into a rotating mechanism for the lever member 553 and return may be made from the clamping state (FIG. 8B) to the unclamping state (FIG. 8A) via the latch mechanism.

Further, although the coupler 78 is provided with a convex-concave structure as shown in FIG. 7C to simultaneously move the tape supporting members 551, 552 in the first embodiment, the tape supporting members 551, 552 may be simultaneously moved by another structure. Further, the tape supporting members 551, 552 may be both opened by moving the tape supporting member 552 at a slightly delayed timing from a movement of the tape supporting member 551.

Further, in the above embodiments, the disclosure is applied to a so-called auto-loading feeder for suppressing the interruption of the supply of the components by automatically sending the succeeding tape 60B to bring the leading end part of the succeeding tape 60B toward the trailing end part of the preceding tape 60A during the supply of the components by the preceding tape 60A. However, an application object of the disclosure is not limited to this and the disclosure can be applied to component supply techniques in general for sending the component supply tape 60 in the longitudinal direction to supply electronic components E1.

As the specific embodiments have been illustrated and described above, the disclosure may be configured, for example, such that a tape supporter includes a supporting member configured to support one principal surface of a component supply tape and a clamping mechanism includes a clamping member capable of pressing the component supply tape against the supporting member and a switcher configured to switchingly hold the component supply tape and release the hold of the component supply tape by moving the clamping member between a clamping position where the clamping member presses and holds the component supply tape against the spring member and an unclamping position where the clamping member is separated from the supporting member to release the hold of the component supply tape. In this way, it is possible to reliably hold the component supply tape and release the hold of the component supply tape at appropriate timings by the clamping mechanism.

Further, the tape supporter may include a biasing member configured to bias the supporting member in a normal direction to the other principal surface of the component supply tape. In this way, a force for supporting the component supply tape from below by the tape supporter corresponds to a biasing force and the component supply tape can be stably supported.

Further, the tape supporter may include an index part configured to indicate a leading end position in a longitudinal direction of a supported part supported by the tape supporter, thereby being able to keep the position of the component supply tape with respect to the tape supporter constant. In this way, the leading end position of the component supply tape at the time of being introduced into a main body can be stabilized and the component supply tape can be reliably sent in the main body thereafter.

A coupling relationship of the tape supporter and the main body is arbitrary, but a mover configured to insert and detach the tape supporter into and from an introducing region while coupling the tape supporter to the main body may be, for example, provided. In this case, the loss of the tape supporter can be prevented when the tape supporter is detached from the main body. Conversely, the tape supporter may be configured to be insertable into and detachable from the introducing region separately from the main body. In this case, a supporting operation of the component supply tape by the tape supporter and a clamping operation of the component supply tape by the clamping mechanism can be performed not only at a position near the main body, but also at a position distant from the main body, and the operability of these can be enhanced.

Although the disclosure has been described by way of the specific embodiments above, this description is not intended to be interpreted in a limited sense. By referring to the description of the disclosure, various modifications of the disclosed embodiments will become apparent to a person skilled in this art similarly to other embodiments of the disclosure. Hence, appended claims are thought to include these modifications and embodiments without departing from the true scope of the disclosure.

This disclosure can be applied to component supplying techniques in general for supplying components by sending a component supply tape in a longitudinal direction of the component supply tape and a surface mounting machine for mounting the components supplied by the above techniques on a board.

The invention claimed is:

1. A component supply device comprising:
   a main body provided with an introducing region into which a component supply tape holding components is introduced, and configured to supply the components to a component supply position by sending the component supply tape introduced into the main body via the introducing region in a longitudinal direction of the component supply tape;
   the main body further including a rear sender and a front sender provided along the longitudinal direction of the component supply tape with respect to the main body, the rear sender configured to send the component supply tape to the front sender, the front sender configured to send the component supply tape to the component supply position;
   a tape supporter detachable from the main body, and insertable into the introducing region while supporting the component supply tape; and
   a clamping mechanism configured to sandwich and hold at least a part of a supported part of the component supply tape supported by the tape supporter with respect to the tape supporter, such that the component supply tape is introduced from the clamping mechanism into the rear sender by inserting the tape supporter into the introducing region with the component supply tape held by the clamping mechanism,
   wherein the tape supporter holds the component supply tape in a detached state away from the introducing region and can be inserted into the introducing region while holding the component supply tape, and
   wherein:
   the tape supporter includes a support configured to support one principal surface of the component supply tape; and
   the clamping mechanism includes:
      a clamping member configured to press the component supply tape against the support; and
      a switcher configured to switchingly hold the component supply tape and release the hold of the component supply tape by moving the clamping member between a clamping position where the clamping member presses and holds the component supply tape against a spring and an unclamping position where the clamping member is separated from the supporting member to release the hold of the component supply tape.

2. A component supply device comprising:
   a main body provided with an introducing region into which a component supply tape holding components is introduced, and configured to supply the components to a component supply position by sending the component supply tape introduced into the main body via the introducing region in a longitudinal direction of the component supply tape;
   the main body further including a rear sender and a front sender provided along the longitudinal direction of the component supply tape with respect to the main body, the rear sender configured to send the component supply tape to the front sender, the front sender configured to send the component supply tape to the component supply position;
   a tape supporter detachable from the main body, and insertable into the introducing region while supporting the component supply tape; and
   a clamping mechanism configured to sandwich and hold at least a part of a supported part of the component supply tape supported by the tape supporter with respect to the tape supporter, such that the component supply tape is introduced from the clamping mechanism into the rear sender by inserting the tape supporter into the introducing region with the component supply tape held by the clamping mechanism,
   wherein the tape supporter holds the component supply tape in a detached state away from the introducing region and can be inserted into the introducing region while holding the component supply tape,
   wherein:
   the tape supporter includes a support configured to support one principal surface of the component supply tape; and the clamping mechanism includes:
a clamping member configured to press the component supply tape against the support; and
a switcher configured to switchingly hold the component supply tape and release the hold of the component supply tape by moving the clamping member between a clamping position where the clamping member presses and holds the component supply tape against a spring and an unclamping position where the clamping member is separated from the supporting member to release the hold of the component supply tape, wherein:
the tape supporter includes a biasing member configured to bias the support in a normal direction to another principal surface of the component supply tape.

3. A component supply device comprising:
a main body provided with an introducing region into which a component supply tape holding components is introduced, and configured to supply the components to a component supply position by sending the component supply tape introduced into the main body via the introducing region in a longitudinal direction of the component supply tape;
the main body further including a rear sender and a front sender provided along the longitudinal direction of the component supply tape with respect to the main body, the rear sender configured to send the component supply tape to the front sender, the front sender configured to send the component supply tape to the component supply position;
a tape supporter detachable from the main body, and insertable into the introducing region while supporting the component supply tape; and
a clamping mechanism configured to sandwich and hold at least a part of a supported part of the component supply tape supported by the tape supporter with respect to the tape supporter, such that the component supply tape is introduced from the clamping mechanism into the rear sender by inserting the tape supporter into the introducing region with the component supply tape held by the clamping mechanism,
wherein the tape supporter holds the component supply tape in a detached state away from the introducing region and can be inserted into the introducing region while holding the component supply tape,
wherein:
the tape supporter includes a support configured to support one principal surface of the component supply tape; and
the clamping mechanism includes:
a clamping member configured to press the component supply tape against the support; and
a switcher configured to switchingly hold the component supply tape and release the hold of the component supply tape by moving the clamping member between a clamping position where the clamping member presses and holds the component supply tape against a spring and an unclamping position where the clamping member is separated from the supporting member to release the hold of the component supply tape, and
wherein:
the tape supporter includes an indexer configured to indicate a leading end position in a longitudinal direction of the supported part supported by the tape supporter.

4. A component supply device comprising:
a main body provided with an introducing region into which a component supply tape holding components is introduced, and configured to supply the components to a component supply position by sending the component supply tape introduced into the main body via the introducing region in a longitudinal direction of the component supply tape;
the main body further including a rear sender and a front sender provided along the longitudinal direction of the component supply tape with respect to the main body, the rear sender configured to send the component supply tape to the front sender, the front sender configured to send the component supply tape to the component supply position;
a tape supporter detachable from the main body, and insertable into the introducing region while supporting the component supply tape; and
a clamping mechanism configured to sandwich and hold at least a part of a supported part of the component supply tape supported by the tape supporter with respect to the tape supporter, such that the component supply tape is introduced from the clamping mechanism into the rear sender by inserting the tape supporter into the introducing region with the component supply tape held by the clamping mechanism,
wherein the tape supporter holds the component supply tape in a detached state away from the introducing region and can be inserted into the introducing region while holding the component supply tape,
wherein:
the tape supporter includes a support configured to support one principal surface of the component supply tape; and
the clamping mechanism includes:
a clamping member configured to press the component supply tape against the support; and
a switcher configured to switchingly hold the component supply tape and release the hold of the component supply tape by moving the clamping member between a clamping position where the clamping member presses and holds the component supply tape against a spring and an unclamping position where the clamping member is separated from the supporting member to release the hold of the component supply tape,
wherein:
the tape supporter includes a biasing member configured to bias the support in a normal direction to another principal surface of the component supply tape, and
wherein:
the tape supporter includes an indexer configured to indicate a leading end position in a longitudinal direction of the supported part supported by the tape supporter.

5. A component supply device comprising:
a main body provided with an introducing region into which a component supply tape holding components is introduced, and configured to supply the components to a component supply position by sending the component supply tape introduced into the main body via the introducing region in a longitudinal direction of the component supply tape;
the main body further including a rear sender and a front sender provided along the longitudinal direction of the component supply tape with respect to the main body, the rear sender configured to send the component supply tape to the front sender, the front sender configured to send the component supply tape to the component supply position;

a tape supporter detachable from the main body, and insertable into the introducing region while supporting the component supply tape; and a clamping mechanism configured to sandwich and hold at least a part of a supported part of the component supply tape supported by the tape supporter with respect to the tape supporter, such that the component supply tape is introduced from the clamping mechanism into the rear sender by inserting the tape supporter into the introducing region with the component supply tape held by the clamping mechanism, wherein the tape supporter holds the component supply tape in a detached state away from the introducing region and can be inserted into the introducing region while holding the component supply tape, wherein:

the tape supporter includes a support configured to support one principal surface of the component supply tape; and the clamping mechanism includes:
a clamping member configured to press the component supply tape against the support; and
a switcher configured to switchingly hold the component supply tape and release the hold of the component supply tape by moving the clamping member between a clamping position where the clamping member presses and holds the component supply tape against a spring and an unclamping position where the clamping member is separated from the supporting member to release the hold of the component supply tape, the component supply device further comprising:

a mover configured to insert and detach the tape supporter into and from the introducing region while coupling the tape supporter to the main body.

6. A component supply device comprising:

a main body provided with an introducing region into which a component supply tape holding components is introduced, and configured to supply the components to a component supply position by sending the component supply tape introduced into the main body via the introducing region in a longitudinal direction of the component supply tape;

the main body further including a rear sender and a front sender provided along the longitudinal direction of the component supply tape with respect to the main body, the rear sender configured to send the component supply tape to the front sender, the front sender configured to send the component supply tape to the component supply position;

a tape supporter detachable from the main body, and insertable into the introducing region while supporting the component supply tape; and a clamping mechanism configured to sandwich and hold at least a part of a supported part of the component supply tape supported by the tape supporter with respect to the tape supporter, such that the component supply tape is introduced from the clamping mechanism into the rear sender by inserting the tape supporter into the introducing region with the component supply tape held by the clamping mechanism, wherein the tape supporter holds the component supply tape in a detached state away from the introducing region and can be inserted into the introducing region while holding the component supply tape, wherein:

the tape supporter includes a support configured to support one principal surface of the component supply tape; and the clamping mechanism includes:
a clamping member configured to press the component supply tape against the support; and
a switcher configured to switchingly hold the component supply tape and release the hold of the component supply tape by moving the clamping member between a clamping position where the clamping member presses and holds the component supply tape against a spring and an unclamping position where the clamping member is separated from the supporting member to release the hold of the component supply tape, wherein:

the tape supporter includes a biasing member configured to bias the support in a normal direction to another principal surface of the component supply tape, and the component supply device further comprising:

a mover configured to insert and detach the tape supporter into and from the introducing region while coupling the tape supporter to the main body.

7. A component supply device comprising:

a main body provided with an introducing region into which a component supply tape holding components is introduced, and configured to supply the components to a component supply position by sending the component supply tape introduced into the main body via the introducing region in a longitudinal direction of the component supply tape;

the main body further including a rear sender and a front sender provided along the longitudinal direction of the component supply tape with respect to the main body, the rear sender configured to send the component supply tape to the front sender, the front sender configured to send the component supply tape to the component supply position;

a tape supporter detachable from the main body, and insertable into the introducing region while supporting the component supply tape; and a clamping mechanism configured to sandwich and hold at least a part of a supported part of the component supply tape supported by the tape supporter with respect to the tape supporter, such that the component supply tape is introduced from the clamping mechanism into the rear sender by inserting the tape supporter into the introducing region with the component supply tape held by the clamping mechanism, wherein the tape supporter holds the component supply tape in a detached state away from the introducing region and can be inserted into the introducing region while holding the component supply tape, wherein:

the tape supporter includes a support configured to support one principal surface of the component supply tape; and the clamping mechanism includes:
a clamping member configured to press the component supply tape against the support; and
a switcher configured to switchingly hold the component supply tape and release the hold of the component supply tape by moving the clamping member between a clamping position where the clamping member presses and holds the component supply tape against a spring and an unclamping position where the clamping member is separated from the supporting member to release the hold of the component supply tape, and wherein:

the tape supporter is insertable into and detachable from the introducing region separately from the main body.

8. A component supply device comprising:

a main body provided with an introducing region into which a component supply tape holding components is introduced, and configured to supply the components to a component supply position by sending the component supply tape introduced into the main body via the introducing region in a longitudinal direction of the component supply tape;

the main body further including a rear sender and a front sender provided along the longitudinal direction of the component supply tape with respect to the main body, the rear sender configured to send the component supply tape to the front sender, the front sender configured to send the component supply tape to the component supply position;

a tape supporter detachable from the main body, and insertable into the introducing region while supporting the component supply tape; and a clamping mechanism configured to sandwich and hold at least a part of a supported part of the component supply tape supported by the tape supporter with respect to the tape supporter, such that the component supply tape is introduced from the clamping mechanism into the rear sender by inserting the tape supporter into the introducing region with the component supply tape held by the clamping mechanism, wherein the tape supporter holds the component supply tape in a detached state away from the introducing region and can be inserted into the introducing region while holding the component supply tape, wherein:

the tape supporter includes a support configured to support one principal surface of the component supply tape; and the clamping mechanism includes:

a clamping member configured to press the component supply tape against the support; and a switcher configured to switchingly hold the component supply tape and release the hold of the component supply tape by moving the clamping member between a clamping position where the clamping member presses and holds the component supply tape against a spring and an unclamping position where the clamping member is separated from the supporting member to release the hold of the component supply tape, wherein:

the tape supporter includes a biasing member configured to bias the support in a normal direction to another principal surface of the component supply tape, and wherein:

the tape supporter is insertable into and detachable from the introducing region separately from the main body.

9. A surface mounting machine comprising:

a component supply device comprising:

a main body provided with an introducing region into which a component supply tape holding components is introduced, and configured to supply the components to a component supply position by sending the component supply tape introduced into the main body via the introducing region in a longitudinal direction of the component supply tape;

the main body further including a rear sender and a front sender provided along the longitudinal direction of the component supply tape with respect to the main body, the rear sender configured to send the component supply tape to the front sender, the front sender configured to send the component supply tape to the component supply position;

a tape supporter detachable from the main body, and insertable into the introducing region while supporting the component supply tape; and a clamping mechanism configured to sandwich and hold at least a part of a supported part of the component supply tape supported by the tape supporter with respect to the tape supporter, such that the component supply tape is introduced from the clamping mechanism into the rear sender by inserting the tape supporter into the introducing region with the component supply tape held by the clamping mechanism, wherein the tape supporter holds the component supply tape in a detached state away from the introducing region and can be inserted into the introducing region while holding the component supply tape, wherein:

the tape supporter includes a support configured to support one principal surface of the component supply tape; and the clamping mechanism includes:

a clamping member configured to press the component supply tape against the support; and a switcher configured to switchingly hold the component supply tape and release the hold of the component supply tape by moving the clamping member between a clamping position where the clamping member presses and holds the component supply tape against a spring and an unclamping position where the clamping member is separated from the supporting member to release the hold of the component supply tape; and a head configured to mount the components supplied from the component supply device on a board.

10. A surface mounting machine comprising:

a component supply device comprising:

a main body provided with an introducing region into which a component supply tape holding components is introduced, and configured to supply the components to a component supply position by sending the component supply tape introduced into the main body via the introducing region in a longitudinal direction of the component supply tape;

the main body further including a rear sender and a front sender provided along the longitudinal direction of the component supply tape with respect to the main body, the rear sender configured to send the component supply tape to the front sender, the front sender configured to send the component supply tape to the component supply position;

a tape supporter detachable from the main body, and insertable into the introducing region while supporting the component supply tape; and a clamping mechanism configured to sandwich and hold at least a part of a supported part of the component supply tape supported by the tape supporter with respect to the tape supporter, such that the component supply tape is introduced from the clamping mechanism into the rear sender by inserting the tape supporter into the introducing region with the component supply tape held by the clamping mechanism, wherein the tape supporter holds the component supply tape in a detached state away from the introducing region and can be inserted into the introducing region while holding the component supply tape, wherein:

the tape supporter includes a support configured to support one principal surface of the component supply tape; and the clamping mechanism includes:
- a clamping member configured to press the component supply tape against the support; and
- a switcher configured to switchingly hold the component supply tape and release the hold of the component supply tape by moving the clamping member between a clamping position where the clamping member presses and holds the component supply tape against a spring and an unclamping position where the clamping member is separated from the supporting member to release the hold of the component supply tape, wherein:
- the tape supporter includes a biasing member configured to bias the support in a normal direction to another principal surface of the component supply tape, and a head configured to mount the components supplied from the component supply device on a board.

* * * * *